United States Patent
Lee et al.

(10) Patent No.: US 9,966,392 B2
(45) Date of Patent: May 8, 2018

(54) LASER ANNEALING APPARATUS AND METHOD OF MANUFACTURING DISPLAY APPARATUS BY USING THE SAME

(71) Applicant: SAMSUNG DISPLAY CO., LTD., Yongin-si, Gyeonggi-do (KR)

(72) Inventors: Hongro Lee, Yongin-si (KR); Chunghwan Lee, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 8 days.

(21) Appl. No.: 15/160,338

(22) Filed: May 20, 2016

(65) Prior Publication Data

US 2017/0117306 A1    Apr. 27, 2017

(30) Foreign Application Priority Data

Oct. 21, 2015   (KR) ........................ 10-2015-0146660

(51) Int. Cl.
  *H01L 21/00*  (2006.01)
  *H01L 21/84*  (2006.01)
  *H01L 27/12*  (2006.01)
  *H01L 21/02*  (2006.01)

(52) U.S. Cl.
  CPC .... *H01L 27/1285* (2013.01); *H01L 21/02675* (2013.01); *H01L 27/1222* (2013.01)

(58) Field of Classification Search
  CPC .......... H01L 21/02675; H01L 27/1285; H01L 27/1222; H01L 27/12
  See application file for complete search history.

(56) References Cited

U.S. PATENT DOCUMENTS

| 5,953,597 A | 9/1999 | Kusumoto et al. |
| 2005/0170572 A1* | 8/2005 | Hongo ............... B23K 26/0738 438/166 |
| 2011/0097907 A1 | 4/2011 | Kawaguchi et al. |
| 2012/0111267 A1 | 5/2012 | Park |

FOREIGN PATENT DOCUMENTS

| JP | 2001332493 A | 11/2001 |
| KR | 1020120048239 A | 5/2012 |
| WO | 2009157373 A1 | 4/2011 |

* cited by examiner

*Primary Examiner* — Charles Garber
*Assistant Examiner* — Abdulfattah Mustapha
(74) *Attorney, Agent, or Firm* — Cantor Colburn LLP

(57) ABSTRACT

A laser annealing apparatus includes: a substrate supporting unit which supports a substrate; a laser beam irradiating unit which irradiates a line laser beam extending in a first direction to an amorphous silicon layer provided on the substrate on the substrate supporting unit; a substrate moving unit which moves the substrate supporting unit in a second direction crossing the first direction; and a first beam cutter and a second beam cutter, which are disposed between the substrate supporting unit and the laser beam irradiating unit, where the first and second beam cutters move to increase or decrease a shielded area of the substrate, which is an area of the substrate overlapping the first or second beam cutter and the line laser beam, to shield from at least a portion of the line laser beam irradiated to a portion of the substrate at an outer portion of the amorphous silicon layer.

23 Claims, 17 Drawing Sheets

LASER ANNEALING APPARATUS AND METHOD OF MANUFACTURING DISPLAY APPARATUS BY USING THE SAME

This application claims priority to Korean Patent Application No. 10-2015-0146660, filed on Oct. 21, 2015, and all the benefits accruing therefrom under 35 U.S.C. § 119, the content of which in its entirety is herein incorporated by reference.

BACKGROUND

1. Field

One or more exemplary embodiments relate to a laser annealing apparatus and a method of manufacturing a display apparatus by using the laser annealing apparatus, and more particularly, to a laser annealing apparatus capable of reducing a defect ratio in a manufacturing process, and a methods of manufacturing a display apparatus by using the laser annealing apparatus.

2. Description of the Related Art

In general, in an organic light-emitting display apparatus or a liquid crystal display apparatus, whether to emit light from each pixel or the amount of light emission of each pixel is controlled using a thin film transistor or the like, which is electrically connected to a pixel electrode of each pixel. The thin film transistor includes a semiconductor layer, and the semiconductor layer includes a polycrystalline silicon layer. Thus, when manufacturing a display apparatus, an amorphous silicon layer is converted into a polycrystalline silicon layer.

In a crystallization process as above, a laser annealing method is widely used, in which a laser beam is irradiated onto an amorphous silicon layer to convert the amorphous silicon layer into a polycrystalline silicon layer. The laser irradiated to the amorphous silicon layer is a line laser beam extending in one direction, and thus, the line laser beam may be irradiated a plurality of times onto the amorphous silicon layer while moving a substrate, on which the amorphous silicon layer is formed, to convert the amorphous silicon layer having a large area into a polycrystalline silicon layer.

SUMMARY

However, in a conventional method of manufacturing a display apparatus, where the polycrystalline silicon layer of the display apparatus is formed through a crystallization process as described above by using the laser annealing apparatus, striped stains may be generated on an image displayed by the display apparatus.

One or more exemplary embodiments include a laser annealing apparatus capable of reducing a defect ratio in a manufacturing process, and a method of manufacturing a display apparatus by using the laser annealing apparatus.

According to an exemplary embodiment, a laser annealing apparatus includes: a substrate supporting unit which supports a substrate; a laser beam irradiating unit which irradiates a line laser beam extending in a first direction to an amorphous silicon layer provided on the substrate on the substrate supporting unit; a substrate moving unit which moves the substrate supporting unit in a second direction crossing the first direction; and a first beam cutter and a second beam cutter, which are disposed between the substrate supporting unit and the laser beam irradiating unit and spaced apart from each other, where the first beam cutter and the second beam cutter moves to increase or decrease a shielded area of the substrate, which is an area of the substrate overlapping the line laser beam and at least one of the first beam cutter and the second beam cutter, to shield from at least a portion of the line laser beam irradiated to a portion of the substrate outside the amorphous silicon layer.

In an exemplary embodiment, the first beam cutter and the second beam cutter may move in the first direction or an opposite direction to the first direction so as to increase or decrease the shielded area of the substrate.

In an exemplary embodiment, as the substrate moving unit moves the substrate supporting unit in the second direction, a portion of the shielded area overlapping the first beam cutter and the line laser beam may be decreased or increased again.

In an exemplary embodiment, as the substrate moving unit moves the substrate supporting unit in the second direction, a portion of the shielded area overlapping the second beam cutter and the line laser beam may be decreased and then increased again.

In an exemplary embodiment, when the line laser beam is irradiated to a first section of the substrate, the first beam cutter may move in the first direction as the substrate moving unit moves the substrate supporting unit in the second direction, such that the portion of the shielded area overlapping the first beam cutter and the line laser beam is decreased. In such an embodiment, when the line laser beam is irradiated to the first section of the substrate, the second beam cutter may move in an opposite direction to the first direction as the substrate moving unit moves the substrate supporting unit in the second direction, such that the portion of the shielded area overlapping the second beam cutter and the line laser beam is decreased. In such an embodiment, when the line laser beam is irradiated to a second section of the substrate, the first beam cutter may move in the opposite direction to the first direction as the substrate moving unit moves the substrate supporting unit in the second direction, such that the portion of the shielded area overlapping the first beam cutter and the line laser beam is increased. In such an embodiment, when the line laser beam is irradiated to the second section of the substrate, the second beam cutter may move in the opposite direction to the first direction as the substrate moving unit moves the substrate supporting unit in the second direction, such that the portion of the shielded area overlapping the second beam cutter and the line laser beam is decreased. In such an embodiment, when the line laser beam is irradiated to a third section of the substrate, the first beam cutter may move in the opposite direction to the first direction as the substrate moving unit moves the substrate supporting unit in the second direction, such that the portion of the shielded area overlapping the first beam cutter and the line laser beam is increased. In such an embodiment, when the line laser beam is irradiated to the third section of the substrate, the second beam cutter may move in the first direction as the substrate moving unit moves the substrate supporting unit in the second direction, such that the portion of the shielded area overlapping the second beam cutter and the line laser beam is increased.

In an exemplary embodiment, the first beam cutter and the second beam cutter may rotate clockwise or counter-clockwise with respect to axes perpendicular to a plane defined by the first direction and the second direction to increase or decrease the portion of the shielded area of the substrate.

In an exemplary embodiment, as the substrate moving unit moves the substrate supporting unit in the second direction, a portion of the shielded area overlapping the first beam cutter and the line laser beam may be decreased or increased.

In an exemplary embodiment, as the substrate moving unit moves the substrate supporting unit in the second direction, a portion of the shielded area overlapping the second beam cutter and the line laser beam may be decreased or increased.

In an exemplary embodiment, when the line laser beam is irradiated to a first section of the substrate, the first beam cutter may rotate clockwise as the substrate moving unit moves the substrate supporting unit in the second direction, such that the portion of the shielded area overlapping the first beam cutter and the line laser beam is decreased. In such an embodiment, when the line laser beam is irradiated to the first section of the substrate, the second beam cutter may rotate clockwise as the substrate moving unit moves the substrate supporting unit in the second direction, such that the portion of the shielded area overlapping the second beam cutter and the line laser beam is decreased. In such an embodiment, when the line laser beam is irradiated to a second section of the substrate, the first beam cutter may rotate counter-clockwise as the substrate moving unit moves the substrate supporting unit in the second direction, such that the portion of the shielded area overlapping the first beam cutter and the line laser beam is increased. In such an embodiment, when the line laser beam is irradiated to the second section of the substrate, the second beam cutter may rotate clockwise as the substrate moving unit moves the substrate supporting unit in the second direction, such that the portion of the shielded area overlapping the second beam cutter and the line laser beam is decreased. In such an embodiment, when the line laser beam is irradiated to a third section of the substrate, the first beam cutter may rotate counter-clockwise as the substrate moving unit moves the substrate supporting unit in the second direction, such that the portion of the shielded area overlapping the first beam cutter and the line laser beam is increased. In such an embodiment, when the line laser beam is irradiated to the third section of the substrate, the second beam cutter may rotate counter-clockwise as the substrate moving unit moves the substrate supporting unit in the second direction, such that the portion of the shielded area overlapping the second beam cutter and the line laser beam is increased.

In an exemplary embodiment, one of the first beam cutter and the second beam cutter may rotate clockwise or counter-clockwise with respect to an axis perpendicular to a plane defined by the first direction and the second direction to increase or decrease the shielded area of the substrate, and the other of the first beam cutter and the second beam cutter may move in the first direction or in an opposite direction to the first direction to increase or decrease the shielded area of the substrate.

In an exemplary embodiment, the laser annealing apparatus may further include a chamber outside of which the laser beam irradiating unit is disposed, where the substrate supporting unit may be disposed in the chamber, the line laser beam may be irradiated from the laser beam irradiating unit to the substrate on the substrate supporting unit through a window of the chamber, and the first beam cutter and the second beam cutter may be disposed in the chamber.

In an exemplary embodiment, the substrate moving unit may rotate the substrate supporting unit with respect to an axis perpendicular to a plane defined by the first direction and the second direction in a way such that a side of the substrate disposed on the substrate supporting unit forms an angle less than 90 degrees with the second direction, and move the substrate supporting unit, on which the substrate including the amorphous silicon layer provided thereon is disposed, in the second direction while the substrate supporting unit is rotated.

According to another exemplary embodiment, a method of manufacturing a display apparatus includes: providing an amorphous silicon layer on a substrate; and irradiating a line laser beam extending in a first direction onto the amorphous silicon layer on the substrate from a laser beam irradiating unit to convert the amorphous silicon layer into a polycrystalline silicon layer, where the line laser beam is irradiated a plurality of times while the substrate, on which the amorphous silicon layer is provided is rotated in a plane defined by the first direction and a second direction crossing the first direction in a way such that a side of the substrate forms an angle less than 90 degrees with respect to the second direction, and while the substrate is being moved in the second direction. In such an embodiment, the irradiating the line laser beam includes moving the substrate in the second direction; and increasing or decreasing a shielded area, which is an area of the substrate shielded from the line laser beam, as the substrate is moved in the second direction.

In an exemplary embodiment, the irradiating the line laser beam may further include: providing a first beam cutter and a second beam cutter between the amorphous silicon layer and the laser beam irradiating unit, wherein each of the first beam cutter and the second beam cutter is disposed to overlap at least a portion of the line laser beam; and moving the first beam cutter in the first direction or in an opposite direction to the first direction, as the substrate is moved in the second direction, to increase or decrease a portion of the shielded area overlapping the first beam cutter and the line laser beam.

In an exemplary embodiment, the irradiating the line laser beam may further include moving the second beam cutter in the first direction or in the opposite direction to the first direction, as the substrate is moved in the second direction, to increase or decrease a portion of the shielded area overlapping the second beam cutter and the line laser beam.

In an exemplary embodiment, the moving the first beam cutter in the first direction or in the opposite direction to the first direction includes: when the line laser beam is irradiated to a first section of the substrate, moving the first beam cutter in the first direction, as the substrate is moved in the second direction, to decrease the portion of the shielded area overlapping the first beam cutter and the line laser beam; when the line laser beam is irradiated to a second section of the substrate, moving the first beam cutter in the opposite direction to the first direction, as the substrate is moved in the second direction, to increase the portion of the shielded area overlapping the first beam cutter and the line laser beam; and when the line laser beam is irradiated to a third section of the substrate, moving the first beam cutter in the opposite direction to the first direction, as the substrate is moved in the second direction, to increase the portion of the shielded area overlapping the first beam cutter and the line laser beam. In such an embodiment, the moving the second beam cutter in the first direction or in the opposite direction to the first direction may further include: when the line laser beam is irradiated to the first section of the substrate, moving the second beam cutter in an opposite direction to the first direction, as the substrate is moved in the second direction, to decrease the portion of the shielded area overlapping the second beam cutter and the line laser beam; when the line laser beam is irradiated to the second section of the substrate, moving the second beam cutter in the opposite direction to the first direction, as the substrate is moved in the second direction, to decrease the portion of the shielded area overlapping the second beam cutter and the line laser beam; and when the line laser beam is irradiated to the third section of the substrate, moving the second beam cutter in the first direction, as the substrate is moved in the second direction, to increase the portion of the shielded area overlapping the second beam cutter and the line laser beam.

In an exemplary embodiment, the amorphous silicon layer may be disposed in a chamber, the line laser beam may be irradiated to the amorphous silicon layer through a window of the chamber, and the first beam cutter and the second beam cutter may be disposed in the chamber.

In an exemplary embodiment, the irradiating the line laser beam may further includes: providing a first beam cutter and a second beam cutter between the amorphous silicon layer and the laser beam irradiating unit, wherein each of the first beam cutter and the second beam cutter is disposed to overlap at least a portion of the line laser beam; and rotating the first beam cutter clockwise or counter-clockwise with respect to an axis perpendicular to a plane defined by the first direction and the second direction, as the substrate is moved in the second direction, to increase or decrease a portion of the shielded area overlapping the first beam cutter and the line laser beam.

In an exemplary embodiment, the irradiating the line laser beam may further include rotating the second beam cutter clockwise or counter-clockwise with respect to an axis perpendicular to the plane defined by the first direction and the second direction, as the substrate is moved in the second direction, to increase or decrease a portion of the shielded area overlapping the second beam cutter and the line laser beam.

In an exemplary embodiment, the rotating the first beam cutter clockwise or counter-clockwise may include: when the line laser beam is irradiated to a first section of the substrate, rotating the first beam cutter rotates clockwise, as the substrate is moved in the second direction, to decrease the portion of the shielded area overlapping the first beam cutter and the line laser beam; when the line laser beam is irradiated to a second section of the substrate, rotating the first beam cutter counter-clockwise, as the substrate is moved in the second direction, to increase the portion of the shielded area overlapping the first beam cutter and the line laser beam; and when the line laser beam is irradiated to a third section of the substrate, rotating the first beam cutter counter-clockwise, as the substrate is moved in the second direction, to increase the portion of the shielded area overlapping the first beam cutter and the line laser beam. In such an embodiment, the rotating the second beam cutter clockwise or counter-clockwise may include: when the line laser beam is irradiated to the first section of the substrate, rotating the second beam cutter clockwise, as the substrate is moved in the second direction, to decrease the portion of the shielded area overlapping the second beam cutter and the line laser beam; when the line laser beam is irradiated to the second section of the substrate, rotating the second beam cutter clockwise, as the substrate is moved in the second direction, to decrease the portion of the shielded area overlapping the second beam cutter and the line laser beam; and when the line laser beam is irradiated to the third section of the substrate, rotating the second beam cutter counter-clockwise, as the substrate is moved in the second direction, to increase the portion of the shielded area overlapping the second beam cutter and the line laser beam.

In an exemplary embodiment, the irradiating the line laser beam may further include: providing a first beam cutter and a second beam cutter between the amorphous silicon layer and the laser beam irradiating unit, wherein each of the first beam cutter and the second beam cutter is disposed to overlap at least a portion of the line laser beam; rotating the first beam cutter clockwise or counter-clockwise with respect to an axis perpendicular to a plane defined by the first direction and the second direction, as the substrate is moved in the second direction, to increase or decrease a portion of the shielded area overlapping the first beam cutter and the line laser beam; and moving the second beam cutter in the first direction or in the opposite direction to the first direction, as the substrate is moved in the second direction, to increase or decrease a portion of the shielded area overlapping the second beam cutter and the line laser beam.

In an exemplary embodiment, the amorphous silicon layer may be disposed in a chamber, the line laser beam may be irradiated to the amorphous silicon layer through a window of the chamber, and the first beam cutter and the second beam cutter may be disposed in the chamber.

BRIEF DESCRIPTION OF THE DRAWINGS

These and/or other features will become apparent and more readily appreciated from the following description of the exemplary embodiments, taken in conjunction with the accompanying drawings, in which.

DETAILED DESCRIPTION

Figure 1:
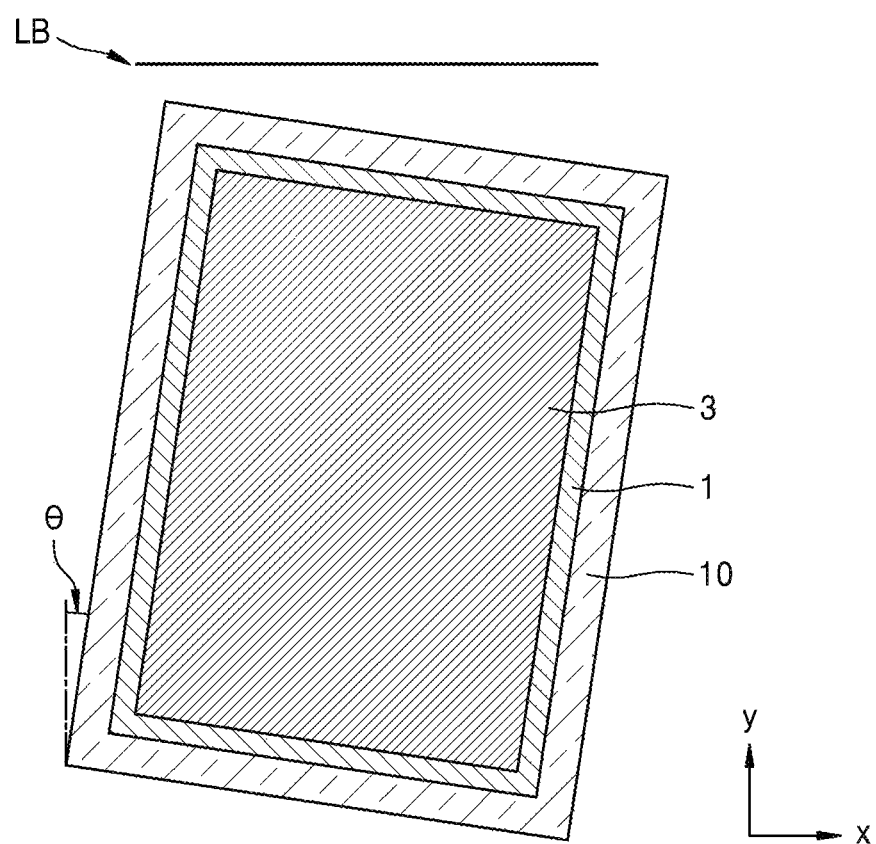
FIGS. 1 through 3 are schematic plan views illustrating processes of manufacturing a display apparatus by using a laser annealing apparatus according to an exemplary embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element is referred to as being "on" or "over" another element, it can be directly on or over the other element or intervening elements may be present therebetween. In contrast, when an element is referred to as being "directly on" or "directly over" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Herein, an x-axis, a y-axis, and a z-axis are not limited to three axes on a rectangular coordinates system but may be construed as including these axes. For example, an x-axis, a y-axis, and a z-axis may be at right angles or may also indicate different directions from one another, which are not at right angles.

Hereinafter, exemplary embodiments of the invention will be described in detail with reference to the accompanying drawings.

Figure 2:
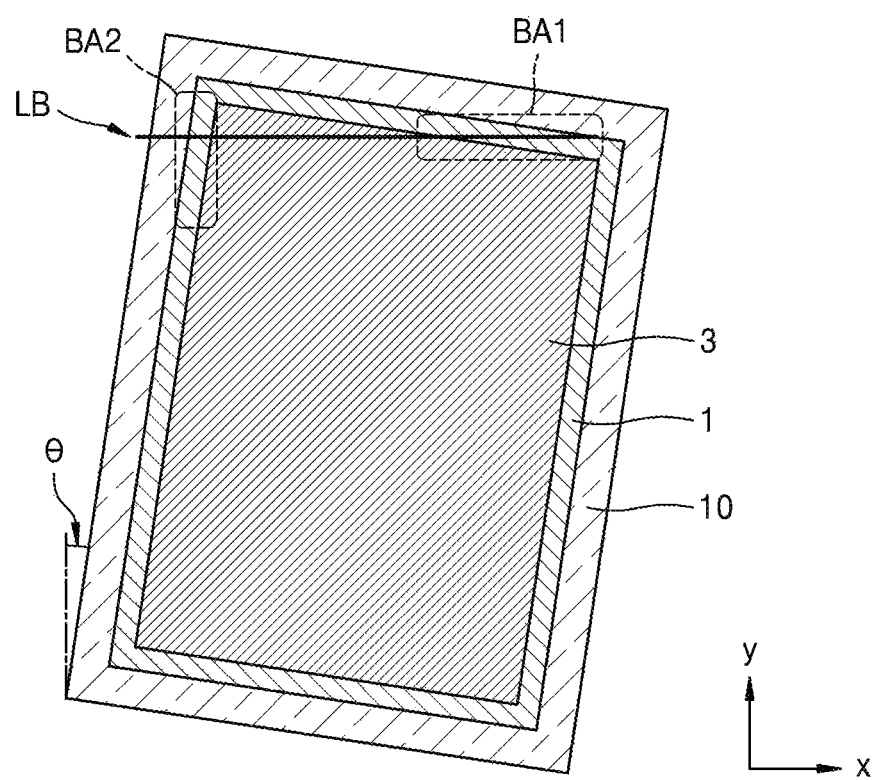
Figure 3:
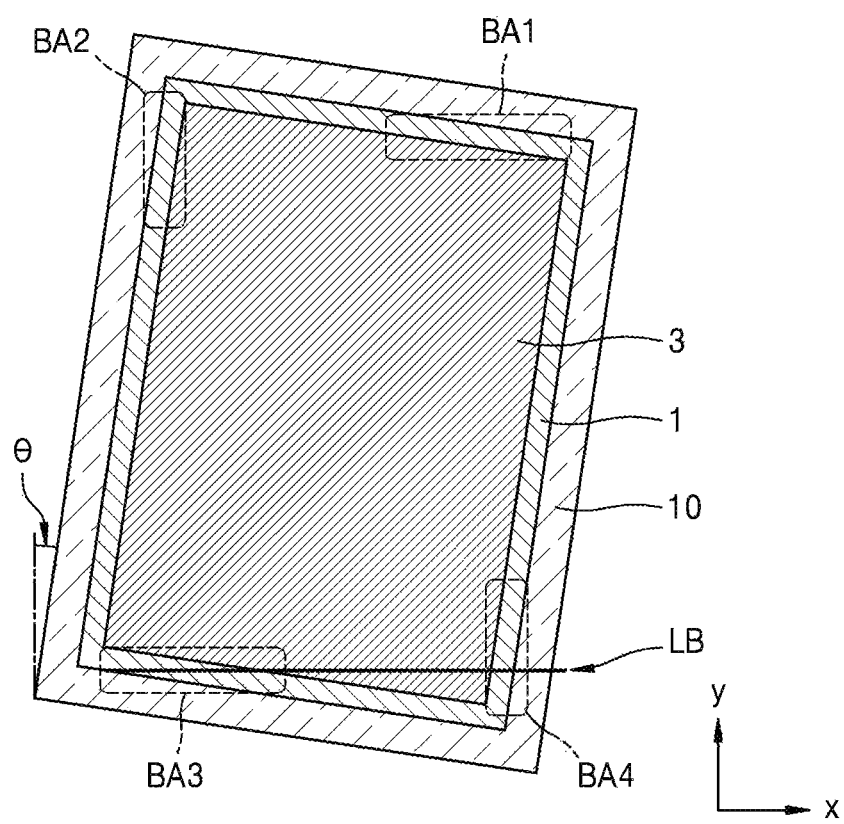

FIGS. 1 through 3 are schematic plan views illustrating processes of a manufacturing a display apparatus by using a laser annealing apparatus according to an exemplary embodiment. An exemplary embodiment of the laser annealing apparatus includes a substrate supporting unit 10, a laser beam irradiating unit (not shown), and a substrate moving unit (not shown).

In an exemplary embodiment of a method of manufacturing a display apparatus by using a laser annealing apparatus, a substrate 1, over which an amorphous silicon layer 3 is formed, may be disposed over the substrate supporting unit 10. The substrate moving unit may move the substrate supporting unit 10. In such an embodiment, the substrate moving unit may move the substrate supporting unit 10 in a second direction (for example, +y direction) that crosses a first direction (for example, +x direction). Also, the substrate moving unit may rotate the substrate supporting unit 10 within a first plane (e.g., the x-y plane) defined by the first direction (+x direction) and the second direction (+y direction). The second direction (+y direction) may be perpendicular to the first direction (+x direction), but is not limited thereto. Hereinafter, for convenience, exemplary embodiments in which the second direction is perpendicular to the first direction will be described in detail.

The laser beam irradiating unit may irradiate a line laser beam LB, e.g., a linear laser beam extending in the first direction (+x direction), to the substrate 1 disposed over the substrate supporting unit 10. Various optical systems through which a laser beam passes may be disposed between the laser beam irradiating unit and the substrate 1 disposed over the substrate supporting unit 10. The laser beam irradiating unit may irradiate, for example, a linear excimer laser beam.

In a conventional method of manufacturing a display apparatus by using a laser annealing apparatus, while a long axis or a short axis of the substrate 1 is disposed to be perpendicular to the first direction (+x direction) in which the line laser beam LB extends, the substrate moving unit may move the substrate supporting unit 10 in the second direction (+y direction) perpendicular to the first direction, and while the substrate moving unit moves the substrate supporting unit 10, the laser beam irradiating unit may irradiate a line laser beam LB a plurality of times onto the substrate 1 to convert the amorphous silicon layer 3 over the substrate 1 into a polycrystalline silicon layer. However, in such a conventional method, striped stains are generated in an image displayed by a display apparatus that is manufactured using the polycrystalline silicon layer formed as above.

In such a conventional method, when laser annealing is performed as described above, some edges (also referred to as first edges) of the substrate 1 are in parallel with the first direction (+x direction) in which the line laser beam LB extends. When a plurality of thin film transistors are formed using the polycrystalline silicon layer formed as described above, thin film transistors on imaginary lines parallel to the first edges of the substrate 1 have approximately identical threshold voltages $V_{th}$, whereas thin film transistors on different imaginary lines which are not parallel to the first edges of the substrate 1 have different threshold voltages $V_{th}$ from each other. Accordingly, when display devices or elements that are connected to the thin film transistors are formed, striped stains that are parallel to the first edges of the substrate 1 may be generated in an image formed by the display apparatus.

According to an exemplary embodiment of the laser annealing apparatus, as illustrated in FIG. 1, the substrate moving unit rotates the substrate supporting unit 10, over which the substrate 1 including the amorphous silicon layer 3 thereon is disposed, at an angle θ, which is less than about 90 degrees to effectively prevent the striped stains from being generated. While the substrate supporting unit 10 is rotated as above, the substrate moving unit moves the substrate supporting unit 10 in the second direction (+y direction), as illustrated in FIGS. 2 and 3.

In an exemplary embodiment, when laser annealing is performed as described above, the extension direction of the line laser beam LB (+x direction) is not parallel to the edges (e.g., the short side edges) of the substrate 1. As a result, when a plurality of thin film transistors are formed using the polycrystalline silicon layer formed as described above, and when display devices or elements are thereafter provided to be electrically connected to the thin film transistors, thin film transistors on imaginary lines that are parallel to the edges of the substrate 1 have different threshold voltages $V_{th}$ from each other. Accordingly, a distribution of the threshold voltages $V_{th}$ of the thin film transistors over the substrate 1 may become substantially uniform overall over the substrate 1. Thus, when a display apparatus is manufactured by using the display devices that are electrically connected to the thin film transistors, striped stains, which may be generated in an image displayed by a display apparatus when manufactured by a conventional method described above, may be effectively prevented or reduced.

In such an embodiment of the laser annealing apparatus and the method of manufacturing a display apparatus by using the laser annealing apparatus, some portions (e.g., a portion not covered by the amorphous silicon layer 3) of the substrate 1 may be damaged, and a defect ratio may be increased during a manufacturing process of the display apparatus. In such an embodiment, as illustrated in FIGS. 2 and 3, when a line laser beam LB is irradiated onto the amorphous silicon layer 3 over the substrate 1 a plurality of times while the substrate moving unit moves the substrate supporting unit 10 in the second direction (+y direction), the line laser beam LB is also irradiated onto portions of the substrate 1 that are not covered by the amorphous silicon layer 3. FIG. 2 illustrates that a line laser beam LB is irradiated to a right uppermost area BA1 and a left uppermost area BA2 of the substrate 1, and FIG. 3 illustrates that a line laser beam LB is irradiated to a left lowermost area BA3 and a right lowermost area BA4 of the substrate 1.

In such an embodiment, the amorphous silicon layer 3 has a thickness of about 3000 nanometers (nm) or more such that the amorphous silicon layer 3 absorbs about 99% or more of an incident line laser beam LB, and thus, portions under the amorphous silicon layer 3 of the substrate 1 are hardly affected by the line laser beam LB. However, exposed portions of the substrate 1, where the amorphous silicon layer 3 is not present, for example, the right uppermost area BA1, the left uppermost area BA2, the left lowermost area BA3 and the right lowermost area BA4, may be damaged by the line laser beam LB. In an exemplary embodiment, where the substrate 1 includes polyimide or the like to implement a flexible display apparatus, some portions of the substrate 1 may be burned when a line laser beam LB is irradiated thereto, and particles generated here may remain on the amorphous silicon layer 3 or a crystallized polycrystalline silicon layer, thereby causing defects. Thus, in an exemplary embodiment, an area where the amorphous silicon layer 3 of the substrate 1 is not present and to which the line laser beam LB is irradiated is desired to be minimized.

Covering the entire surface of the substrate 1 with the amorphous silicon layer 3 may be considered to prevent damages to a portion of the substrate 1. However, even when the amorphous silicon layer 3 is provided to cover the entire surface of the substrate 1, a thickness of the amorphous silicon layer 3 near edges of the substrate 1 is less than a thickness thereof in a central portion of the substrate 1. When the thickness of the amorphous silicon layer 3 near edges of the substrate 1 is not substantially thick, energy of the line laser beam LB may not be sufficiently absorbed by the amorphous silicon layer 3 but be transferred to the substrate 1 under the amorphous silicon layer 3, and accordingly, portions of the substrate 1 near edges of the substrate 1 may be damaged.

Alternatively, a length of a line laser beam LB in the first direction (+x direction) may be decreased so that the line laser beam LB is not irradiated to a portion of the substrate 1 that is not covered by the amorphous silicon layer 3. However, when a length of a line laser beam LB in the first direction (+x direction) is decreased as above, the line laser beam LB may not be irradiated to some portions of the amorphous silicon layer 3 when the line laser beam LB is irradiated along the second direction, and the entire amorphous silicon layer 3 may not be effectively crystallized.

FIGS. 4 through 9 are schematic plan views illustrating processes of manufacturing a display apparatus by using a laser annealing apparatus according to another exemplary embodiment, which is designed to prevent the substrate 1 from being damaged. In an exemplary embodiment, the laser annealing apparatus includes a substrate supporting unit 10, a laser beam irradiating unit (not shown), a substrate moving unit (not shown), and a first beam cutter BC1 and a second beam cutter BC2.

Figure 4:
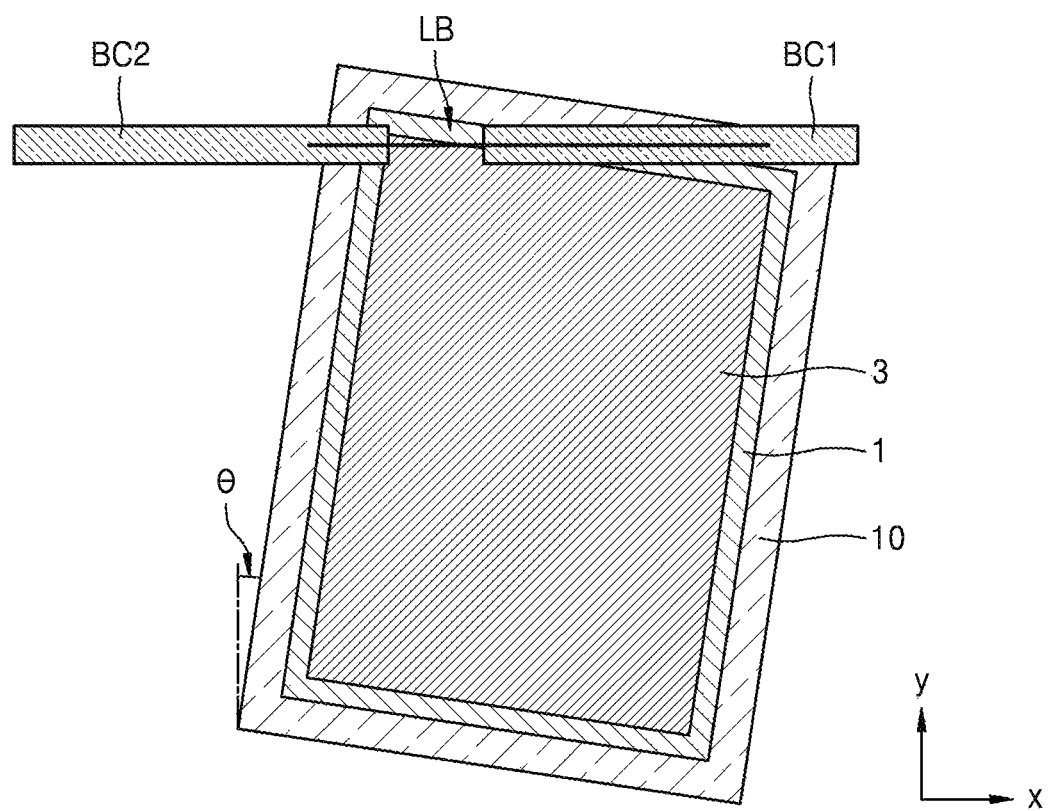
FIGS. 4 through 9 are schematic plan views illustrating processes of manufacturing a display apparatus by using a laser annealing apparatus according to another exemplary embodiment.

According to an exemplary embodiment of the laser annealing apparatus, the substrate moving unit rotates the substrate supporting unit 10, over which the substrate 1 including the amorphous silicon layer 3 formed thereon, is disposed at an angle θ that is less than about 90 degrees, as illustrated in FIG. 4. In FIG. 4, the substrate moving unit is illustrated as moving the substrate supporting unit 10 by an angle θ in a clockwise direction. Accordingly, edges of the substrate 1 are not in parallel with the first direction (+x direction) in which a line laser beam LB extends.

In such an embodiment, while the substrate supporting unit 10 is rotated, the substrate moving unit moves the substrate supporting unit 10 in the second direction (+y direction) that crosses the first direction (+x direction). In such an embodiment, while the substrate moving unit moves the substrate supporting unit 10 in the second direction (+y direction), the laser beam irradiating unit irradiates a line laser beam LB onto the substrate 1 including the amorphous silicon layer 3 formed thereon and disposed over the substrate supporting unit 10, a plurality of times, to convert the amorphous silicon layer 3 into a polycrystalline silicon layer.

In such an embodiment, the first beam cutter BC1 and the second beam cutter BC2 spaced apart from each other move to increase or decrease a shielded area shielding from the line laser beam LB irradiated from the laser beam irradiating unit, thereby shielding from at least a portion of the line laser beam LB irradiated to an outer portion of the amorphous silicon layer 3 of the substrate 1. In such an embodiment, the first beam cutter BC1 and the second beam cutter BC2 move in the first direction (+x direction) or a direction opposite thereto (−x direction) to increase or decrease a shielded area in which the first beam cutter BC1 and the second beam cutter BC2 shield from the line laser beam LB or block the line laser beam LB from being irradiated to a layer disposed therebelow, during laser annealing. In such an embodiment, as the substrate moving unit moves the substrate supporting unit 10 in the second direction (+y direction), the shielded area, in which the first beam cutter BC1 and the second beam cutter BC2 shield from the line laser beam LB irradiated from the laser beam irradiating unit, is decreased or increased.

In an exemplary embodiment, as illustrated in FIG. 4, the first beam cutter BC1 may be disposed to cover the area of a portion of the substrate 1 that is not covered by the amorphous silicon layer 3 to shield from the line laser beam LB at a right upper portion of the substrate 1 when the line laser beam LB is irradiated to a first section (e.g., an upper end portion) of the substrate 1 such that the line laser beam LB is not irradiated to a portion of the substrate 1 that is not covered by the amorphous silicon layer 3. The second beam cutter BC2 may also shield or covers a left upper portion of the substrate 1 when the line laser beam LB is irradiated to the upper end portion of the substrate 1 such that the line laser beam LB is not irradiated to a portion of the substrate 1 that is not covered by the amorphous silicon layer 3.

Figure 5:
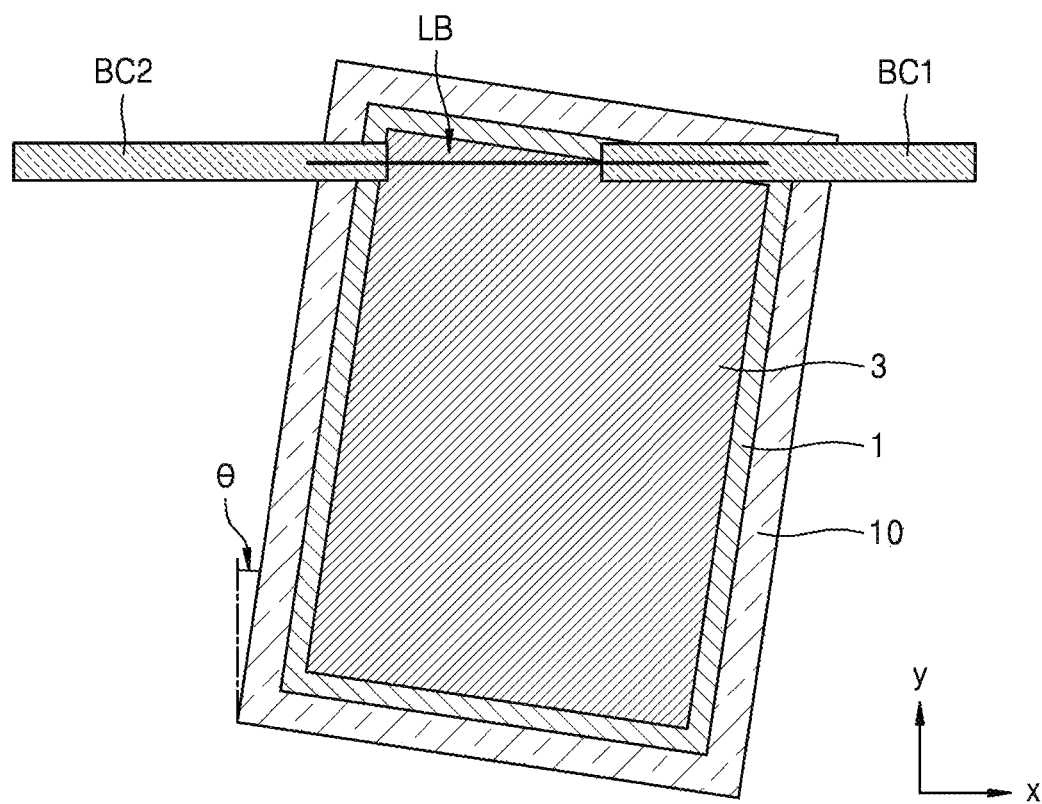

As the substrate moving unit moves the substrate supporting unit 10 in the second direction (+y direction) as illustrated in FIG. 5, the first beam cutter BC1 moves in the first direction (+x direction) to decrease the shielded area in which the first beam cutter BC1 shields from the line laser beam LB irradiated from the laser beam irradiating unit. This is because an irradiation area of the line laser beam LB reaching the amorphous silicon layer 3 is increased, and an irradiation area of the line laser beam LB reaching a portion of the substrate 1 around an outer upper portion of the amorphous silicon layer 3 is decreased. If the substrate moving unit moves the substrate supporting unit 10 further in the second direction (+y direction) as illustrated in FIG. 6 so that the line laser beam LB is no longer irradiated to a portion of the substrate 1 that is not covered by the amorphous silicon layer 3, the first beam cutter BC1 may not shield from the line laser beam LB.

In such an embodiment, as illustrated in FIG. 5, as the substrate moving unit moves the substrate supporting unit 10 in the second direction (+y direction), the second beam cutter BC2 moves in an opposite direction (−x direction) to the first direction (+x direction) to decrease a shielded area in which the second beam cutter BC2 shields from the line laser beam LB irradiated from the laser beam irradiating unit. This is because an irradiation area of the line laser beam LB reaching a portion of the substrate 1 in a left upper outside portion of the amorphous silicon layer 3 is decreased.

Figure 6:
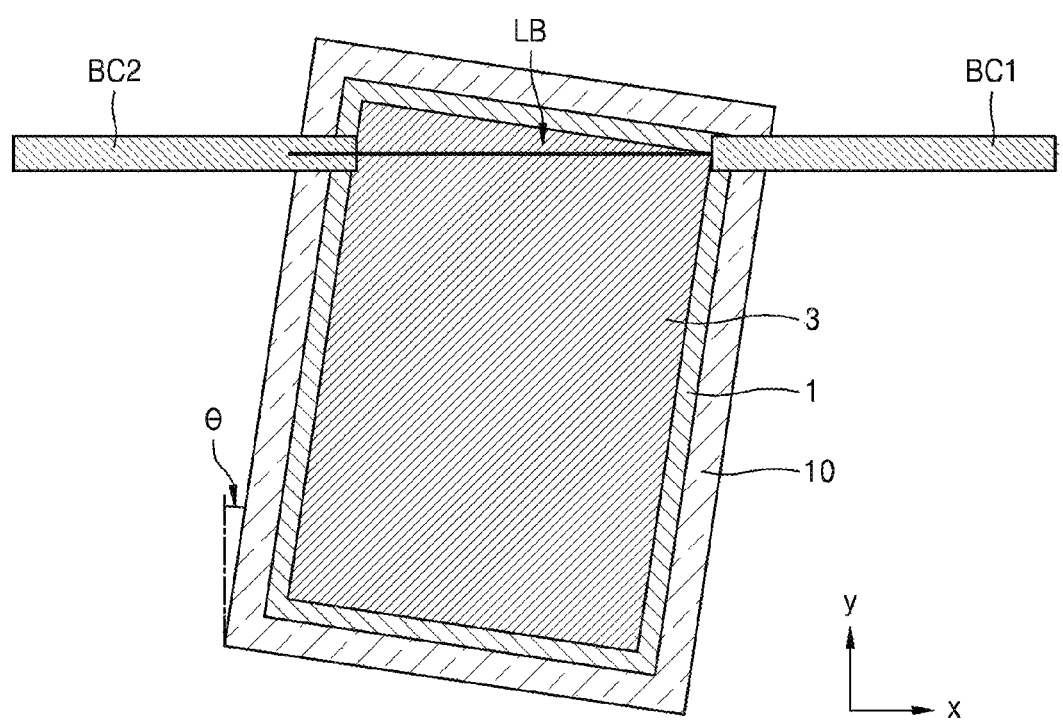
Figure 7:
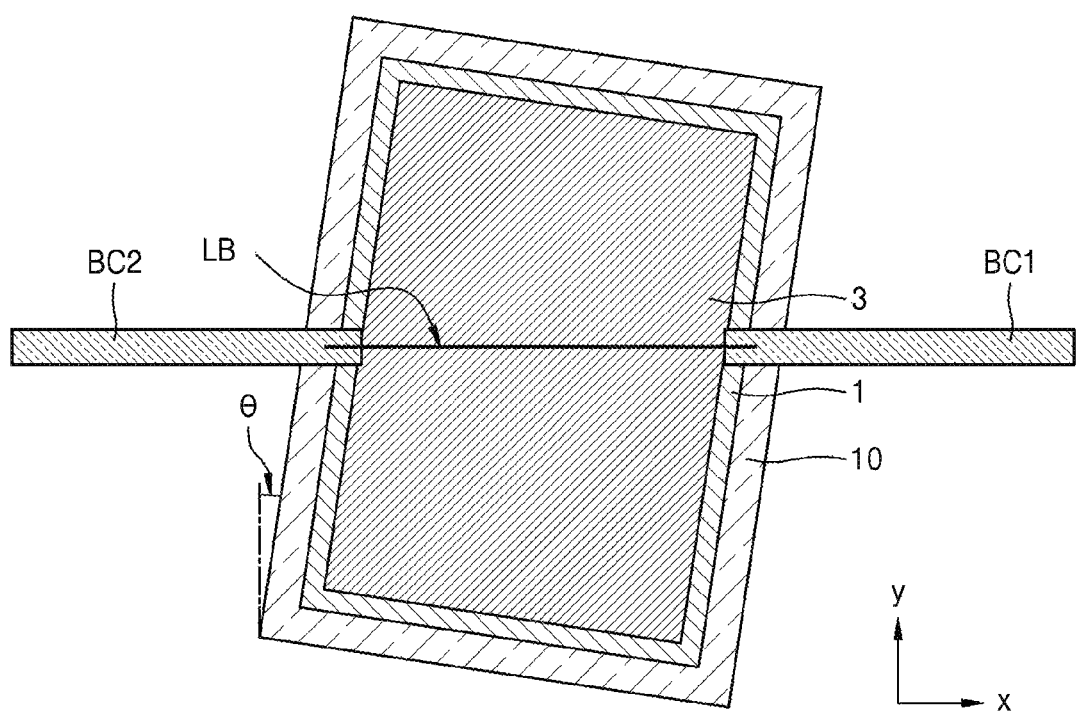
Figure 8:
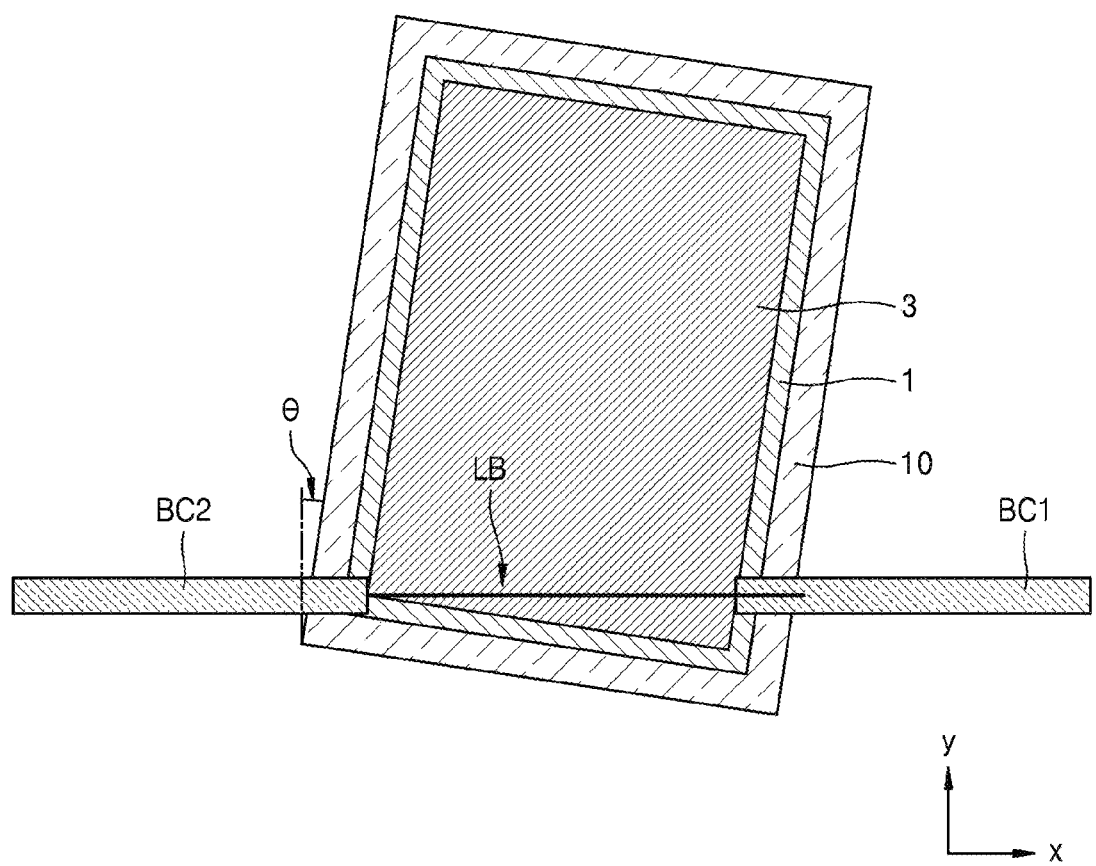

After the line laser beam LB is irradiated to the first section of the amorphous silicon layer 3 on the substrate 1 as illustrated in FIGS. 4 through 6, movement of the first beam cutter BC1 is varied when the line laser beam LB is irradiated to a second section (e.g., a middle portion) of the amorphous silicon layer 3 on the substrate 1 as illustrated in FIGS. 6 through 8. That is, as the substrate moving unit moves the substrate supporting unit 10 further in the second direction (+y direction), the first beam cutter BC1 moves in an opposite direction to the first direction (+x direction) so that the shielded area, in which the first beam cutter BC1 shields from the line laser beam LB irradiated from the laser beam irradiating unit, is increased. This is because a portion of the irradiation area of the line laser beam LB reaching a portion of the substrate 1 in a right outer portion of the amorphous silicon layer 3 is increased. In such an embodiment, when the line laser beam LB is irradiated to the second section of the amorphous silicon layer 3 on the substrate 1 as illustrated in FIGS. 6 through 8, the second beam cutter BC2 moves in the opposite direction to the first direction (+x direction) to decrease the shielded area in which the second beam cutter BC2 shields from the line laser beam LB irradiated from the laser beam irradiating unit. This is because a portion of the irradiation area of the line laser beam LB reaching a portion of the substrate 1 in a left outer portion of the amorphous silicon layer 3 is decreased. In such an embodiment, when the line laser beam LB is irradiated to the second section of the amorphous silicon layer 3 on the substrate 1 as illustrated in FIGS. 6 through 8, the distance between the first and second beam cutters BC1 and BC2 may be maintained to be constant.

After the line laser beam LB is irradiated to the second section of the amorphous silicon layer 3 on the substrate 1, movement of the second beam cutter BC2 is varied when the line laser beam LB is irradiated to a third section (e.g., a lower end portion) of the amorphous silicon layer 3 on the substrate 1. When the line laser beam LB is irradiated to the third section, as the substrate moving unit moves the substrate supporting unit 10 further in the second direction (+y direction), the second beam cutter BC2 moves in the first direction (+x direction) so that the shielded area, in which the second beam cutter BC2 shields from the line laser beam LB irradiated from the laser beam irradiating unit, is increased. This is because a portion of the irradiation area of the line laser beam LB reaching the amorphous silicon layer 3 is decreased, and a portion of the irradiation area of the line laser beam LB reaching a portion of the substrate 1 in a lower outer portion of the amorphous silicon layer 3 is increased as the substrate moving unit moves the substrate supporting unit 10 further in the second direction (+y direction). The first beam cutter BC1 moves further in the opposite direction to the first direction (+x direction) to increase the shielded area in which the first beam cutter BC1 shields from the line laser beam LB irradiated from the laser beam irradiating unit.

According to an exemplary embodiment of the laser annealing apparatus, a line laser beam LB is irradiated to the entire area or most portions of the amorphous silicon layer 3 over the substrate 1 to convert the amorphous silicon layer 3 into a polycrystalline silicon layer, and a portion of the substrate 1 which is not covered by the amorphous silicon layer 3 and to which the line laser beam LB is irradiated may be substantially decreased or minimized. Accordingly, damages to the substrate 1 formed of a polymer material such as polyimide, which may occur during a conventional laser annealing process, may be substantially decreased or minimized, such that a damage ratio of the substrate 1 may be substantially decreased or minimized. In such an embodiment, during subsequent formation of thin film transistors or display devices, such defects may be effectively prevented or a defect ratio may be substantially decreased.

In an exemplary embodiment, as illustrated in FIGS. 4 through 9, a position of the first beam cutter BC1 in the second direction (+y direction), a position of the second beam cutter BC2 in the second direction (+y direction), and a position of the line laser beam LB may be fixed, and the substrate supporting unit 10 may be moved by the substrate moving unit, and the first beam cutter BC1 and the second beam cutter BC2 may be linearly moving in the first direction (+x direction) or in an opposite direction thereto (−x direction). In such an embodiment, movement directions of the first beam cutter BC1 and the second beam cutter BC2 may be restricted by, for example, a guide rail. In an alternative exemplary embodiment, the substrate supporting unit 10 may be fixed, and the first beam cutter BC1, the second beam cutter BC2 and the line laser beam LB may move in a direction opposite to the second direction (−y direction).

Figure 10:
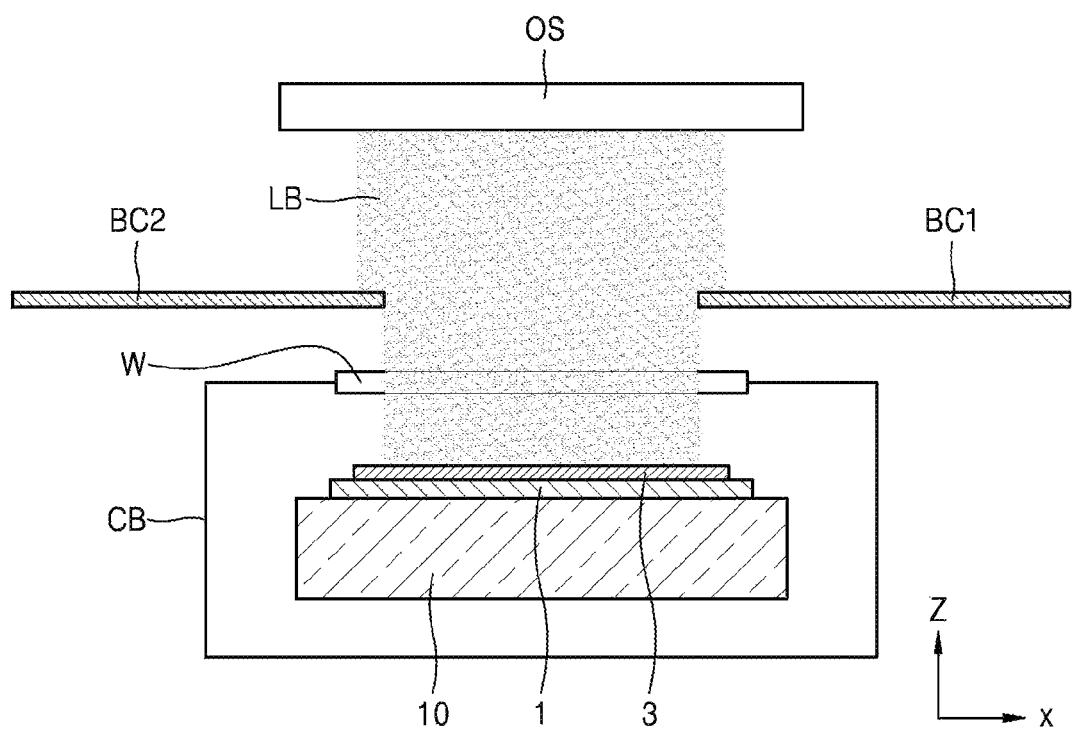
FIG. 10 is a lateral conceptual diagram illustrating a process of manufacturing a display apparatus by using a laser annealing apparatus, according to an alternative exemplary embodiment.
Figure 11:
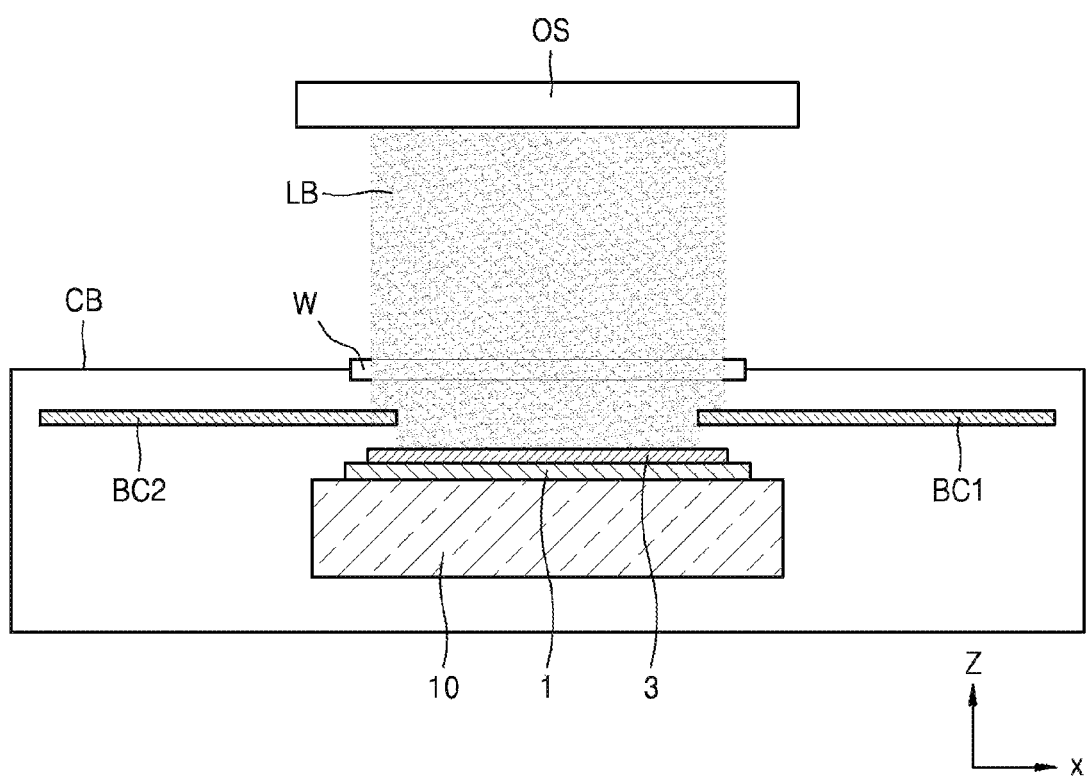
FIG. 11 is a schematic lateral conceptual diagram illustrating a process of manufacturing a display apparatus by using a laser annealing apparatus, according to another alternative exemplary embodiment.

FIG. 10 is a lateral conceptual diagram illustrating a process of manufacturing a display apparatus by using a laser annealing apparatus, according to an alternative exemplary embodiment, and FIG. 11 is a schematic lateral conceptual diagram illustrating a process of manufacturing a display apparatus by using a laser annealing apparatus, according to another alternative exemplary embodiment.

As illustrated in FIG. 10, an exemplary embodiment of the laser annealing apparatus may further include a chamber CB. A laser beam irradiating unit (not shown) may be located outside the chamber CB, and the substrate supporting unit 10 may be located inside the chamber CB and moved by a substrate moving unit (not shown). The chamber CB includes a window W so that, after a line laser beam LB irradiated from the laser beam irradiating unit passes through an optical system OS or the like, the line laser beam LB passes through the window W to be irradiated to the amorphous silicon layer 3 on the substrate 1, which is disposed on the substrate supporting unit 10. The first beam cutter BC1 and the second beam cutter BC2 may be located above the chamber CB along a +z direction.

In such an embodiment, although the line laser beam LB has high straightness, optical phenomena such as diffraction may occur due to basic characteristics of light. When a portion of the line laser beam LB is shielded by the first beam cutter BC1 and the second beam cutter BC2, a portion of the line laser beam LB that is not shielded by the first beam cutter BC1 and the second beam cutter BC2 may still be spread due to diffraction or the like so that the line laser beam LB may be irradiated to a portion of the substrate 1 that is not covered by the amorphous silicon layer 3. In an alternative exemplary embodiment, to prevent or reduce the undesired irradiation of the line laser beam LB to the portion of the substrate 1 that is not covered by the amorphous silicon layer 3 due to diffraction, the first beam cutter BC1 and the second beam cutter BC2 may be disposed inside the chamber CB, as illustrated in FIG. 11. In such an embodiment, a distance between the first and second beam cutters BC1 and BC2 and the substrate 1 may be substantially reduced. Accordingly, in such an embodiment, even when a portion of the line laser beam LB that is not shielded by the first beam cutter BC1 and the second beam cutter BC2 is spread due to diffraction or the like, an area of the substrate 1 which is not covered by the amorphous silicon layer 3 and to which the line laser beam LB is irradiated due to the spreading of the line laser beam LB may be minimized.

FIGS. 12 through 17 are schematic plan views illustrating processes of manufacturing a display apparatus by using a laser annealing apparatus, according to another alternative exemplary embodiment.

According to an exemplary embodiment of the laser annealing apparatus, the first beam cutter BC1 and the second beam cutter BC2 may linearly move as shown in FIGS. 4 through 9, but not being limited thereto. In an alternative exemplary embodiment, the first beam cutter BC1 and the second beam cutter BC2 may rotate as shown in FIGS. 12 through 17. In such an embodiment, the first beam cutter BC1 and the second beam cutter BC2 may rotate clockwise or counter-clockwise within a plane that is parallel to a first plane defined by a first direction (+x direction) and a second direction (+y direction) to increase or decrease a shielded area on the substrate 1, which is shielded from a line laser beam LB irradiated from the laser beam irradiating unit. In such an embodiment, as the substrate moving unit moves the substrate supporting unit 10 in the second direction (+y direction), a shielded area, in which the first beam cutter BC1 and the second beam cutter BC2 shield from the line laser beam LB irradiated from the laser beam irradiating unit, is decreased or increased.

Figure 12:
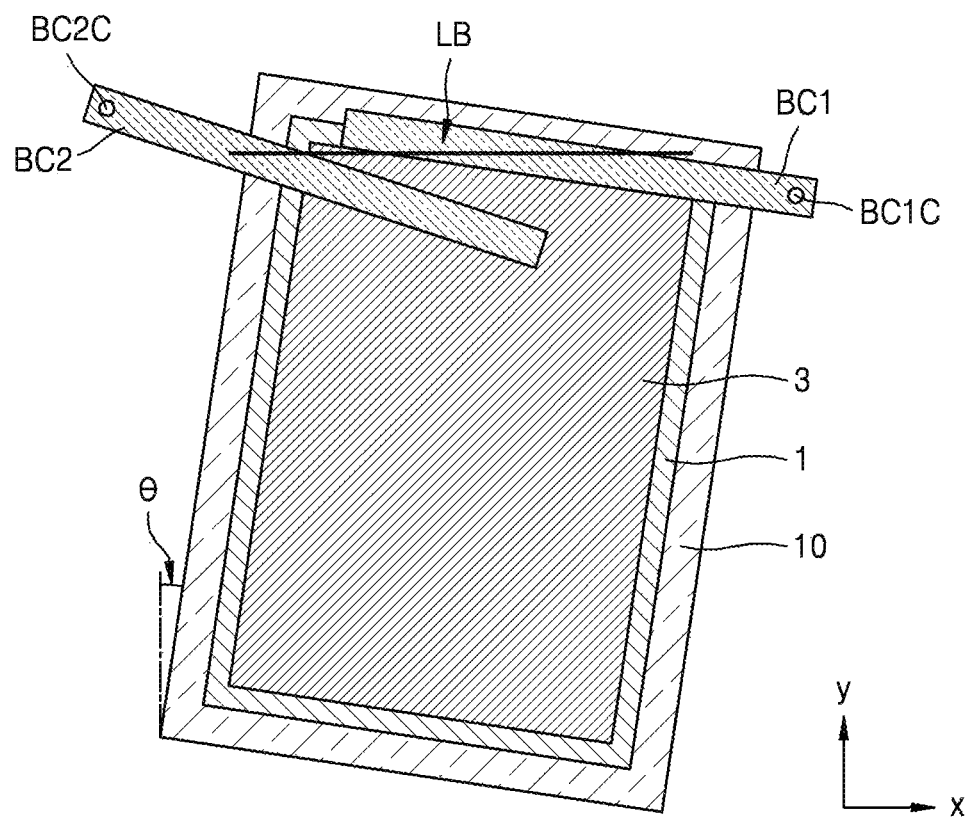
FIGS. 12 through 17 are schematic plan views illustrating processes of manufacturing a display apparatus by using a laser annealing apparatus, according to another alternative exemplary embodiment.

In such an embodiment, when the line laser beam LB is irradiated to a first section (e.g., an upper end portion) of the substrate 1, as illustrated in FIG. 12, the first beam cutter BC1 shields from the line laser beam LB at an upper portion of the substrate 1 such that the line laser beam LB is not irradiated to a portion of the substrate 1 that is not covered by the amorphous silicon layer 3. When the line laser beam LB is irradiated to the first section of the substrate 1, the second beam cutter BC2 may further shield from the line laser beam LB in a left upper portion of the substrate 1 such that the line laser beam LB is not irradiated to a portion of the substrate 1 that is not covered by the amorphous silicon layer 3.

Figure 13:
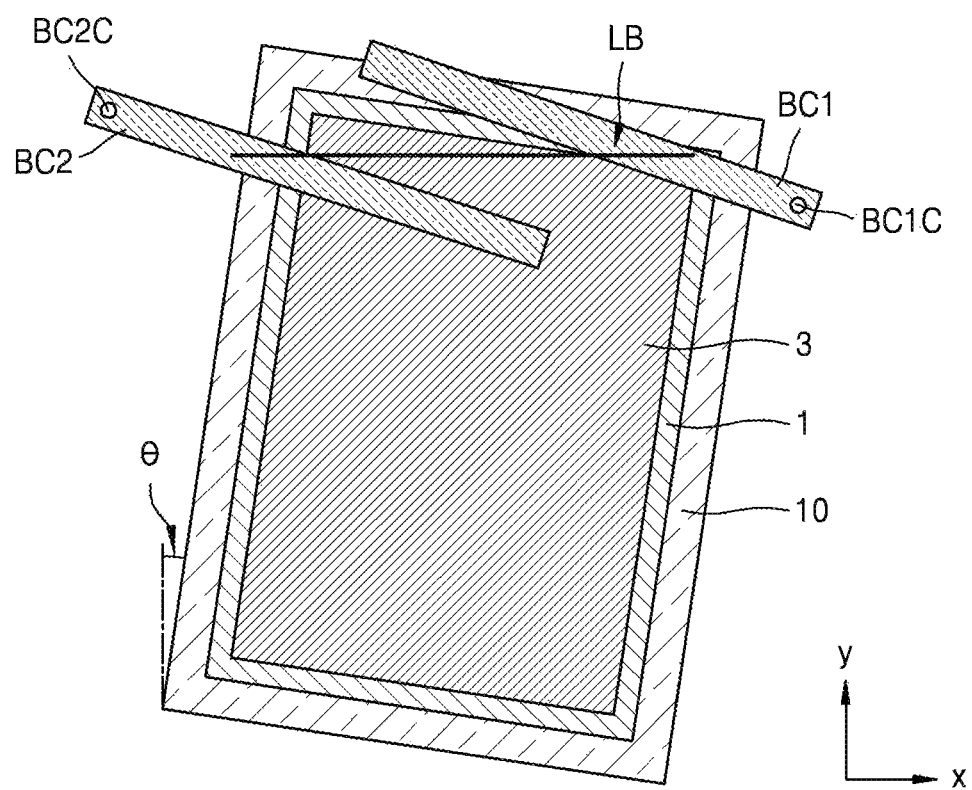
Figure 14:
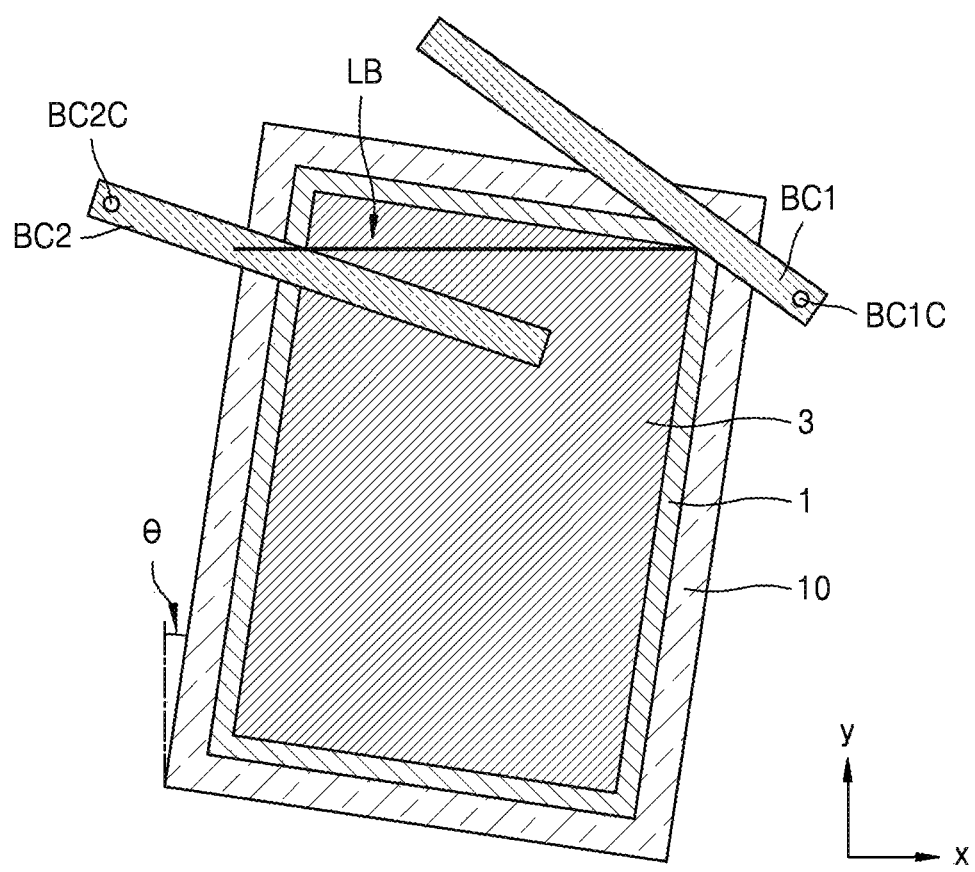

When the line laser beam LB is irradiated to the first section of the substrate 1, as the substrate moving unit moves the substrate supporting unit 10 in the second direction (+y direction) as illustrated in FIGS. 13 and 14, the first beam cutter BC1 rotates clockwise with respect to a first rotational axis BC1C to decrease the shielded area in which the first beam cutter BC1 shields from the line laser beam LB irradiated from the laser beam irradiating unit. This is because an irradiation area of the line laser beam LB reaching the amorphous silicon layer 3 is increased, and an irradiation area of the line laser beam LB reaching the substrate 1 is decreased as the substrate moving unit moves the substrate supporting unit 10 in the second direction (+y direction). When the substrate moving unit moves the substrate supporting unit 10 further in the second direction (+y direction) as illustrated in FIG. 14 so that the line laser beam LB is no longer irradiated to a portion of the substrate 1 that is not covered by the amorphous silicon layer 3, the first beam cutter BC1 may not shield from the line laser beam LB.

When the line laser beam LB is irradiated to the first section of the substrate 1, as illustrated in FIGS. 13 and 14, as the substrate moving unit moves the substrate supporting unit 10 in the second direction (+y direction), the second beam cutter BC2 rotates clockwise with respect to a second rotational axis BC2C to decrease the shielded area in which the second beam cutter BC2 shields from the line laser beam LB irradiated from the laser beam irradiating unit. This is because an irradiation area of the line laser beam LB reaching a portion of the substrate 1 in a left upper outside portion of the amorphous silicon layer 3 is decreased.

Figure 15:
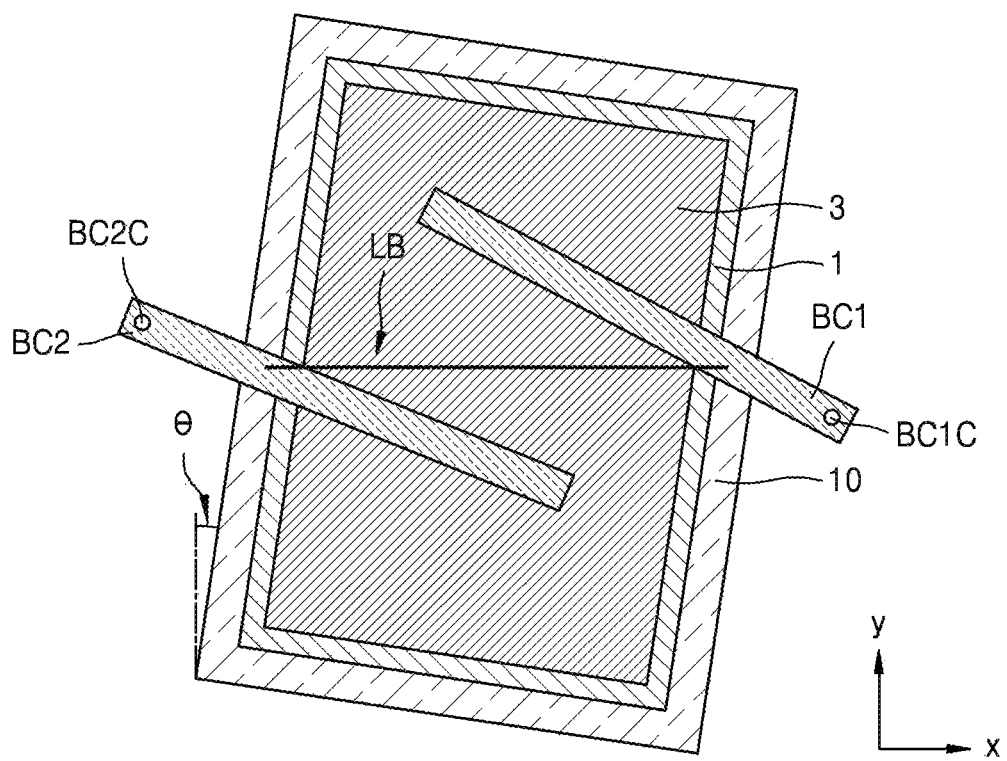
Figure 16:
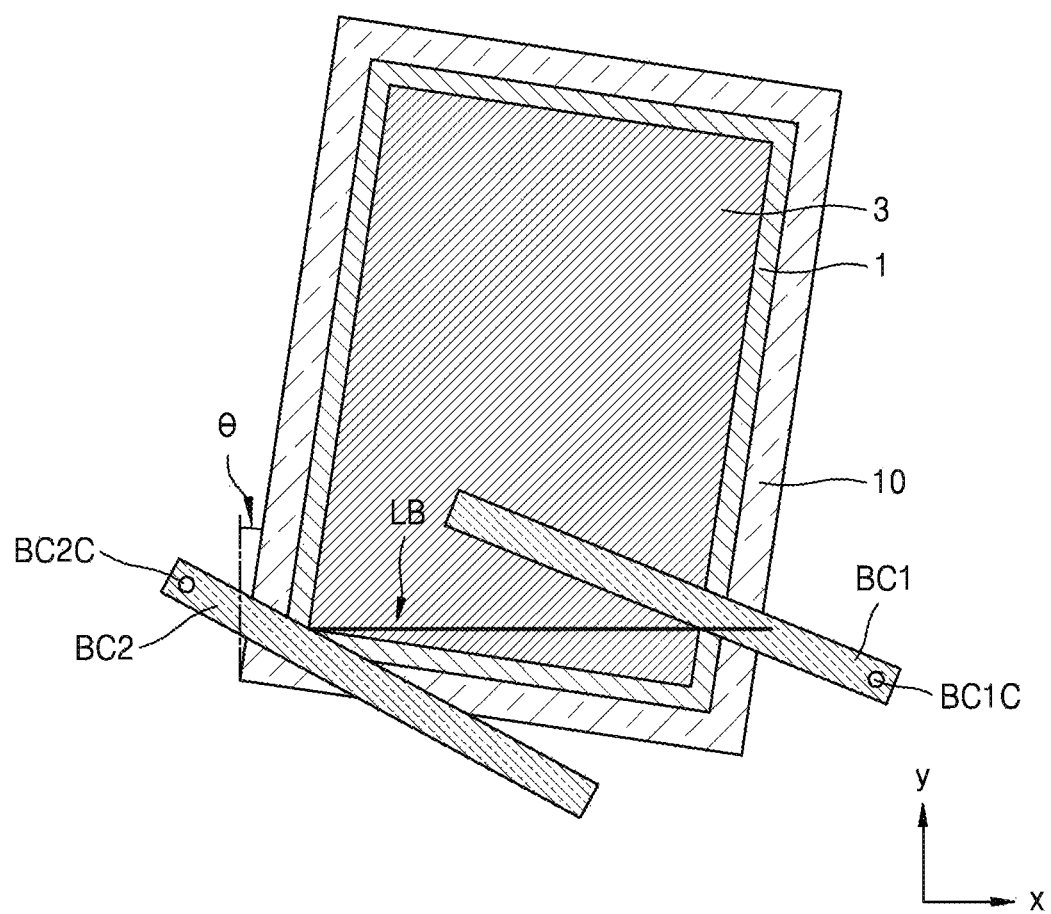

After the line laser beam LB is irradiated to the first section of the substrate 1 as illustrated in FIGS. 12 through 14, movement of the first beam cutter BC1 is varied as shown in FIGS. 14 through 16 when the line laser beam LB is irradiated to a second section (e.g., a middle portion) of the substrate 1. When the line laser beam LB is irradiated to the second section of the substrate 1 as shown in FIGS. 14 through 16, as the substrate moving unit moves the substrate supporting unit 10 further in the second direction (+y direction), the first beam cutter BC1 rotates counter-clockwise with respect to the first rotational axis BC1C so that the shielded area, in which the first beam cutter BC1 shields from the line laser beam LB irradiated from the laser beam irradiating unit, is increased. This is because a portion of the irradiation area of the line laser beam LB reaching a portion of the substrate 1 in a right outer portion of the amorphous silicon layer 3 is increased as the substrate moving unit moves the substrate supporting unit 10 further in the second direction (+y direction). When the line laser beam LB is irradiated to the second section of the substrate 1 as shown in FIGS. 14 through 16, the second beam cutter BC2 rotates clockwise with respect to the second rotational axis BC2C to decrease the shielded area in which the second beam cutter BC2 shields from the line laser beam LB irradiated from the laser beam irradiating unit. This is because a portion of the irradiation area of the line laser beam LB reaching a portion of the substrate 1 in a left outer portion of the amorphous silicon layer 3 is decreased as the substrate moving unit moves the substrate supporting unit 10 further in the second direction (+y direction).

Figure 17:
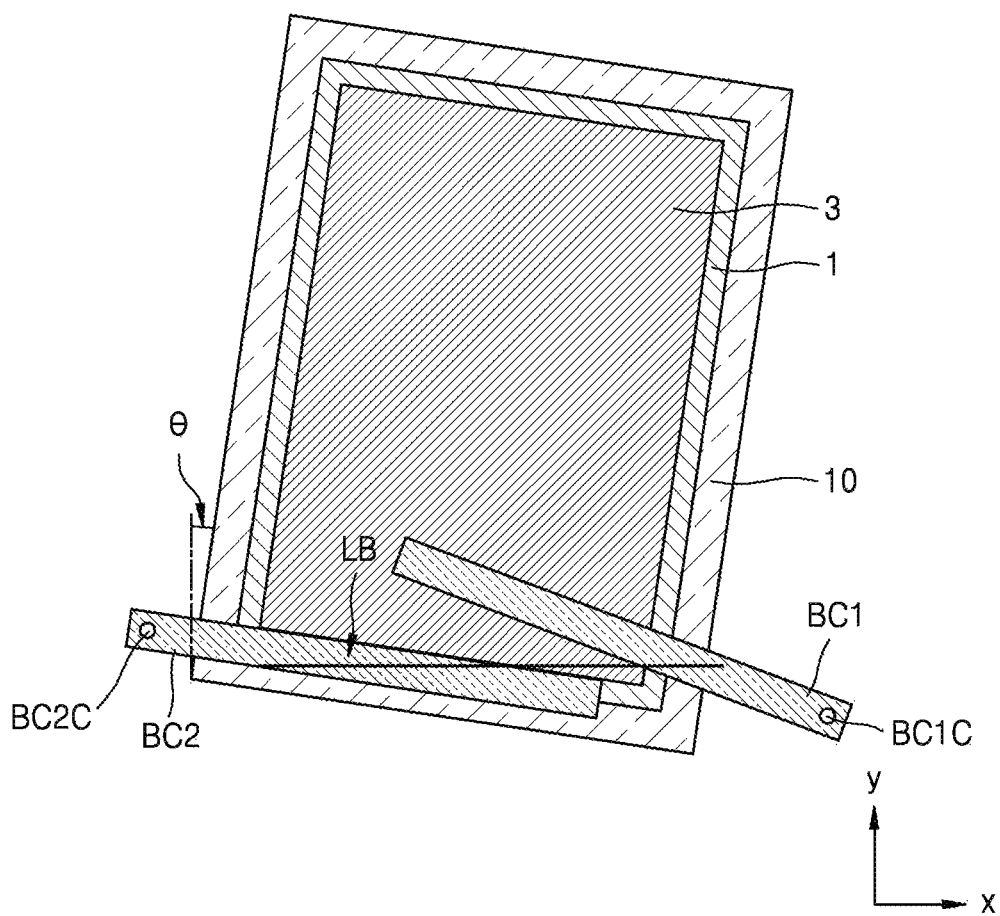

After the line laser beam LB is irradiated to the second section of the substrate 1 as shown in FIGS. 14 through 16, movement of the second beam cutter BC2 is varied when the line laser beam LB is irradiated to a third section (e.g., a lower end portion) of the substrate 1 as shown in FIGS. 16 and 17. That is, as the substrate moving unit moves the substrate supporting unit 10 further in the second direction (+y direction), the second beam cutter BC2 rotates counter-clockwise with respect to the second rotational axis BC2C so that the shielded area, in which the second beam cutter BC2 shields from the line laser beam LB irradiated from the laser beam irradiating unit, is increased. This is because a portion of the irradiation area of the line laser beam LB reaching the amorphous silicon layer 3 is decreased, and a portion of the irradiation area of the line laser beam LB reaching a portion of the substrate 1 in a lower outer portion of the amorphous silicon layer 3 is increased. Accordingly, irradiation of the line laser beam LB to the lower end portion of the substrate 1 may be prevented or minimized. The first beam cutter BC1 further rotates counter-clockwise with respect to the first rotational axis BC1C to increase the shielded area in which the first beam cutter BC1 shields from the line laser beam LB irradiated from the laser beam irradiating unit.

According to an exemplary embodiment of the laser annealing apparatus, irradiation of a line laser beam LB to most portions of the substrate 1 may be prevented or minimized. Accordingly, damages to the substrate 1 formed of a polymer material such as polyimide, which may occur during a conventional laser annealing process, may be substantially reduced or a damage ratio of the substrate 1 may be substantially reduced. In such an embodiment, during subsequent formation of thin film transistors or display devices, such defects may be effectively prevented or a defect ratio may be remarkably reduced.

In an exemplary embodiment, as illustrated in FIGS. 12 through 17, a position of the line laser beam LB and positions of the first rotational axis BC1C and the second rotational axis BC2C may be fixed, and the substrate supporting unit 10 may be moving by the substrate moving unit, and the first beam cutter BC1 and the second beam cutter BC2 may be rotating. In an exemplary embodiment, when the first beam cutter BC1 and the second beam cutter BC2 rotate, the first beam cutter BC1 and the second beam cutter BC2 may be located inside the chamber CB.

In an alternative exemplary embodiment, a laser annealing apparatus may have a combination structure of the laser annealing apparatus described with reference to FIGS. 4 through 9 and the laser annealing apparatus described with reference to FIGS. 12 through 17. In such an embodiment, the laser annealing apparatus may include a first beam cutter and a second beam cutter, one of the first and second beam cutters may rotate clockwise or counter-clockwise in a plane parallel to a first plane to increase or decrease a shielded area shielding from a line laser beam irradiated from a laser beam irradiating unit, similarly to the first beam cutter BC1 or the second beam cutter BC2 according to the method of manufacturing a display apparatus described with reference to FIGS. 12 through 17. In such an embodiment, the other of the first beam cutter and the second beam cutter may move in a first direction (+x direction) or an opposite direction (−x direction) to the first direction, similarly to the first beam cutter BC1 or the second beam cutter BC2 of the laser annealing apparatus described with reference to FIGS. 4 through 9, to increase or decrease a shielded area shielding from a line laser beam irradiated from the laser beam irradiating unit.

According to another alternative exemplary embodiment, a laser annealing apparatus of another exemplary embodiment, a beam cutter may simultaneously rotate and linearly move. In one exemplary embodiment, for example, the first beam cutter BC1 as illustrated in FIG. 12 may rotate with respect to the first rotational axis BC1C, and the first rotational axis BC1C may be moved in the first direction (+x direction) or the opposite direction (−x direction) thereto at the same time.

While the laser annealing apparatus has been described above, the exemplary embodiments of the invention are not limited thereto, and further provide a laser annealing method by using the laser annealing apparatus or a method of manufacturing a display apparatus by using the laser annealing apparatus.

An exemplary embodiment of the method of manufacturing a display apparatus may include providing, e.g., forming, an amorphous silicon layer 3 over a substrate 1 and irradiating a line laser beam LB extending in a first direction (+x direction), to the amorphous silicon layer 3 to convert the amorphous silicon layer 3 into a polycrystalline silicon layer. In such an embodiment, the irradiating the line laser beam LB may include irradiating the line laser beam LB a plurality of times while rotating the substrate 1, over which the amorphous silicon layer 3 is formed, at an angle θ that is less than 90 degrees in a first plane (x-y plane) defined by a first direction (+x direction) and a second direction (+y direction), and while moving the substrate 1, over which the amorphous silicon layer 3 is formed, in the second direction (+y direction). In such an embodiment, the first beam cutter BC1 and the second beam cutter BC2 may be provided to cover at least a portion of the substrate 1 to be shielded from the line laser beam LB.

In such an embodiment, at an initial stage of laser annealing, as illustrated in FIG. 4, the first beam cutter BC1 may be disposed to cover the area of a portion of the substrate 1 that is not covered by the amorphous silicon layer 3 to shield from the line laser beam LB at a right upper portion of the substrate 1 when the line laser beam LB is irradiated to a first section (e.g., an upper end portion) of the substrate 1 such that the line laser beam LB is not irradiated to a portion of the substrate 1 that is not covered by the amorphous silicon layer 3. The second beam cutter BC2 may shield from the line laser beam LB in a left upper portion of the substrate 1 when the line laser beam LB is irradiated to the first section such that the line laser beam LB is not irradiated to a portion of the substrate 1 that is not covered by the amorphous silicon layer 3.

As the substrate 1 is further moved in the second direction (+y direction), as illustrated in FIG. 5, the first beam cutter BC1 moves in the first direction (+x direction) to decrease the shielded area of the substrate 1 which overlaps (e.g., covered by when viewed from a top view in a direction perpendicular to the first and second direction) so that the first beam cutter BC1 shields from the line laser beam LB irradiated from the laser beam irradiating unit. This is because an irradiation area of the line laser beam LB reaching the amorphous silicon layer 3 is increased, and an irradiation area of the line laser beam LB reaching the substrate 1 is decreased when the line laser beam LB is irradiated to the first section. When the substrate 1 is being moved further in the second direction (+y direction) as illustrated in FIG. 6 so that the line laser beam LB is no longer irradiated to a portion of the substrate 1 that is not covered by the amorphous silicon layer 3, the first beam cutter BC1 may not shield from the line laser beam LB.

In such an embodiment, as illustrated in FIG. 5, as the substrate moving unit further moves the substrate supporting unit 10 in the second direction (+y direction), the second beam cutter BC2 may move in an opposite direction (−x direction) to the first direction (+x direction) to decrease the shielded area in which the second beam cutter BC2 shields from the line laser beam LB irradiated from the laser beam irradiating unit. This is because an irradiation area of the line laser beam LB reaching a portion of the substrate 1 in a left upper outside portion of the amorphous silicon layer 3 is decreased.

After the line laser beam LB is irradiated to the first section as illustrated in FIGS. 4 through 6, the line laser beam LB is irradiated to a second section (e.g., a middle portion) of the substrate 1, as illustrated in FIGS. 6 through 8. In such an embodiment, movement of the first beam cutter BC1 is varied when the line laser beam LB is irradiated to the second section. That is, as the substrate moving unit moves the substrate supporting unit 10 further in the second direction (+y direction), the first beam cutter BC1 moves in the opposite direction to the first direction (+x direction) so that the shielded area, in which the first beam cutter BC1 shields from the line laser beam LB irradiated from the laser beam irradiating unit, is increased. This is because a portion of the irradiation area of the line laser beam LB reaching a portion of the substrate 1 in a right outer portion of the amorphous silicon layer 3 is increased when the line laser beam LB is irradiated to the second section. In such an embodiment, the second beam cutter BC2 still moves in the opposite direction to the first direction (+x direction) to decrease the shielded area in which the second beam cutter BC2 shields from the line laser beam LB irradiated from the laser beam irradiating unit. This is because a portion of the irradiation area of the line laser beam LB reaching a portion of the substrate 1 in a left outer portion of the amorphous silicon layer 3 is decreased when the line laser beam LB is irradiated to the second section.

Figure 9:
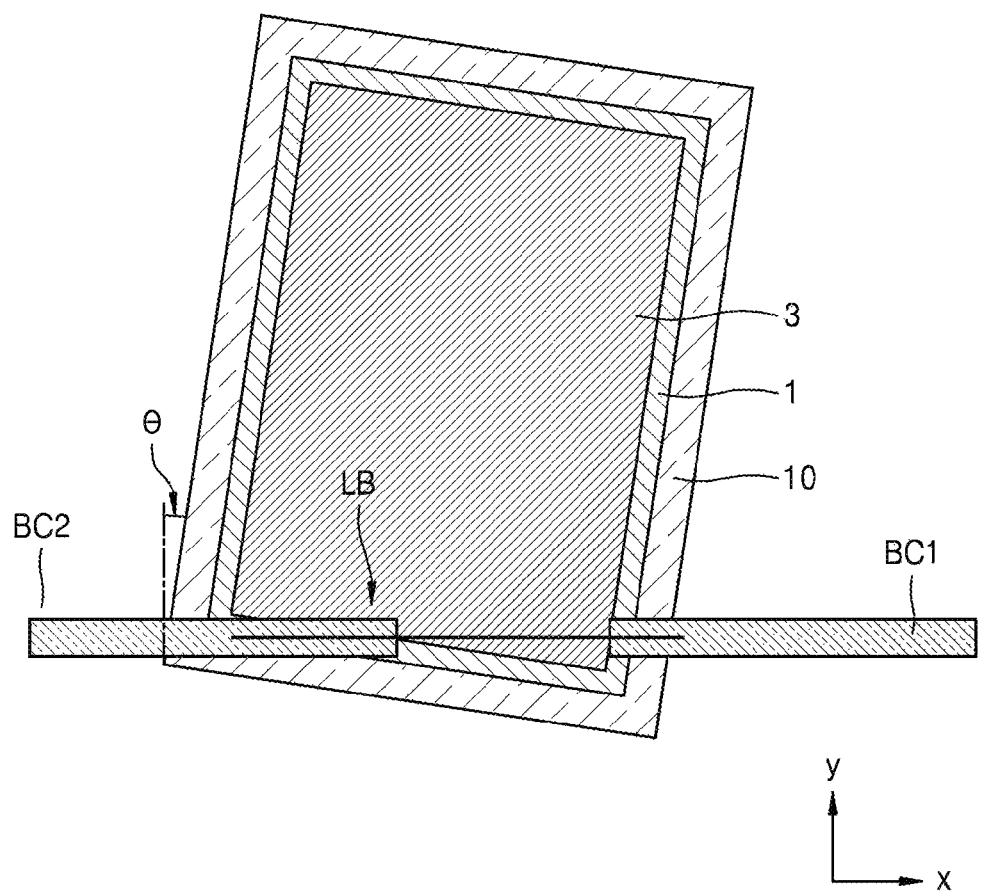

After the line laser beam LB is irradiated to the second section, the line laser beam LB is irradiated to a third section (e.g., a lower end portion) of the substrate 1 as illustrated in FIGS. 8 and 9. When the line laser beam LB is irradiated to the second section, movement of the second beam cutter BC2 is varied. In such an embodiment, as the substrate moving unit moves the substrate supporting unit 10 further in the second direction (+y direction), the second beam cutter BC2 moves in the first direction (+x direction) so that the shielded area, in which the second beam cutter BC2 shields from the line laser beam LB irradiated from the laser beam irradiating unit, is increased. This is because a portion of the irradiation area of the line laser beam LB reaching the amorphous silicon layer 3 is decreased, and a portion of the irradiation area of the line laser beam LB reaching a portion of the substrate 1 in a lower outer portion of the amorphous silicon layer 3 is increased as the substrate moving unit moves the substrate supporting unit 10 further in the second direction (+y direction) when the line laser beam LB is irradiated to the second section. The first beam cutter BC1 moves further in the opposite direction to the first direction (+x direction) to increase the shielded area in which the first beam cutter BC1 shields from the line laser beam LB irradiated from the laser beam irradiating unit.

According to an exemplary embodiment of the method of manufacturing a display apparatus, a line laser beam LB is irradiated to the entire area or most portions of the amorphous silicon layer 3 on the substrate 1 to convert the amorphous silicon layer 3 into a polycrystalline silicon layer, and an area of the substrate 1 which is not covered by the amorphous silicon layer 3 and to which the line laser beam LB is irradiated may be substantially reduced or minimized. Accordingly, damages to the substrate 1 formed of a polymer material such as polyimide, which may occur during a conventional laser annealing process, may be substantially reduced or a damage ratio of the substrate 1 may be remarkably reduced. In such an embodiment, during subsequent formation of thin film transistors or display devices, defects that may occur in a conventional annealing process described above may be effectively prevented or a defect ratio may be substantially reduced.

According to an exemplary embodiment of a method of manufacturing a display apparatus, as illustrated in FIGS. 12 through 17, the first beam cutter BC1 and the second beam cutter BC2 may be used. According to an exemplary embodiment of the method of manufacturing a display apparatus, the first beam cutter BC1 and the second beam cutter BC2 may linearly move as described with reference to FIGS. 4 through 9. In an alternative exemplary embodiment, as shown in FIGS. 12 through 17, first beam cutter BC1 and the second beam cutter BC2 may rotate. In such an embodiment, the first beam cutter BC1 and the second beam cutter BC2 rotate clockwise or counter-clockwise in a plane parallel to a first plane (x-y plane) that is defined by a first direction (+x direction) and a second direction (+y direction) to increase or decrease a shielded area of the substrate 1, that is, an area of the substrate 1 overlapping the line laser beam LB and at least one of the first beam cutter BC1 and the second beam cutter BC2 and thereby shielded from a line laser beam LB. In such an embodiment, as the substrate moving unit moves the substrate supporting unit 10 in the second direction (+y direction), the shielded area, in which the first beam cutter BC1 and the second beam cutter BC2 shield from the line laser beam LB irradiated from the laser beam irradiating unit, is decreased or increased.

In such an embodiment, when the line laser beam LB is irradiated to the first section (e.g., an upper end portion) of the substrate 1 as illustrated in FIG. 12, the first beam cutter BC1 shields from the line laser beam LB at an upper portion of the substrate 1 such that the line laser beam LB is not irradiated to a portion of the substrate 1 that is not covered by the amorphous silicon layer 3. The second beam cutter BC2 may also shield from the line laser beam LB in a left upper portion of the substrate 1 such that the line laser beam LB is not irradiated to a portion of the substrate 1 that is not covered by the amorphous silicon layer 3.

When the line laser beam LB is irradiated to the first section of the substrate 1, as the substrate moving unit moves the substrate supporting unit 10 in the second direction (+y direction) as illustrated in FIGS. 13 and 14, the first beam cutter BC1 rotates clockwise with respect to a first rotational axis BC1C to decrease the shielded area, in which the first beam cutter BC1 shields from the line laser beam LB irradiated from the laser beam irradiating unit. This is because an irradiation area of the line laser beam LB reaching the amorphous silicon layer 3 is increased, and then an irradiation area of the line laser beam LB reaching the substrate 1 is decreased as the substrate moving unit moves the substrate supporting unit 10 further in the second direction (+y direction). When the substrate moving unit moves the substrate supporting unit 10 further in the second direction (+y direction) as illustrated in FIG. 14 so that the line laser beam LB is no longer irradiated to a portion of the substrate 1 that is not covered by the amorphous silicon layer 3, the first beam cutter BC1 may not shield from the line laser beam LB.

In such an embodiment, as illustrated in FIGS. 13 and 14, as the substrate moving unit moves the substrate supporting unit 10 in the second direction (+y direction), the second beam cutter BC2 rotates clockwise with respect to a second rotational axis BC2C in the second section to decrease the shielded area, in which the second beam cutter BC2 shields from the line laser beam LB irradiated from the laser beam irradiating unit. This is because an irradiation area of the line laser beam LB reaching a portion of the substrate 1 in a left upper outside portion of the amorphous silicon layer 3 is decreased.

After the first section as illustrated in FIGS. 12 through 14, when the line laser beam LB is irradiated to a second section (e.g., a middle portion) of the substrate 1 as illustrated in FIGS. 14 through 16, movement of the first beam cutter BC1 is varied. When the line laser beam LB is irradiated to the second section, as the substrate moving unit moves the substrate supporting unit 10 further in the second direction (+y direction), the first beam cutter BC1 rotates counter-clockwise with respect to the first rotational axis BC1C so that the shielded area, in which the first beam cutter BC1 shields from the line laser beam LB irradiated from the laser beam irradiating unit, is increased. This is because a portion of the irradiation area of the line laser beam LB reaching a portion of the substrate 1 in a right outer portion of the amorphous silicon layer 3 is increased. When the line laser beam LB is irradiated to the second section, the second beam cutter BC2 rotates clockwise with respect to the second rotational axis BC2C to decrease the shielded area in which the second beam cutter BC2 shields from the line laser beam LB irradiated from the laser beam irradiating unit as the substrate moving unit moves the substrate supporting unit 10 further in the second direction (+y direction). This is because a portion of the irradiation area of the line laser beam LB reaching a portion of the substrate 1 in a left outer portion of the amorphous silicon layer 3 is decreased.

After the second section, when the line laser beam LB is irradiated to a third section (e.g., a lower end portion) of the substrate 1 as illustrated in FIGS. 16 and 17, movement of the second beam cutter BC2 is varied. When the line laser beam LB is irradiated to the third section, as the substrate moving unit moves the substrate supporting unit 10 further in the second direction (+y direction), the second beam cutter BC2 rotates counter-clockwise with respect to the second rotational axis BC2C so that the shielded area, in which the second beam cutter BC2 shields from the line laser beam LB irradiated from the laser beam irradiating unit, is increased. This is because a portion of the irradiation area of the line laser beam LB reaching the amorphous silicon layer 3 is decreased, and a portion of the irradiation area of the line laser beam LB reaching a portion of the substrate 1 in a lower outer portion of the amorphous silicon layer 3 is increased as the substrate moving unit moves the substrate supporting unit 10 further in the second direction (+y direction). Accordingly, irradiation of the line laser beam LB to a lower portion of the substrate 1 that is not covered by the amorphous silicon layer 3 may be effectively prevented or minimized. The first beam cutter BC1 further rotates counter-clockwise with respect to the first rotational axis BC1C to increase the shielded area in which the first beam cutter BC1 shields from the line laser beam LB irradiated from the laser beam irradiating unit.

According to an exemplary embodiment of the method of manufacturing a display apparatus, a line laser beam LB is irradiated to the entire area or most portions of the amorphous silicon layer 3 on the substrate 1 to convert the amorphous silicon layer 3 into a polycrystalline silicon layer, and an area of the substrate 1 which is not covered by the amorphous silicon layer 3 and to which the line laser beam LB is irradiated may be substantially reduced. Accordingly, damages to the substrate 1 formed of a polymer material, such as polyimide, which may occur during a conventional laser annealing process as described above, may be substantially reduced or a damage ratio of the substrate 1 may be substantially reduced. In such an embodiment, during subsequent formation of thin film transistors or display devices, such defects may be effectively prevented or a defect ratio may be substantially reduced or minimized.

In an exemplary embodiment, a method of manufacturing a display apparatus may use the laser annealing apparatus having a combination structure of a structure described with reference to FIGS. 4 through 9 and a structure described with reference to FIGS. 12 through 17. In such an embodiment of the method of manufacturing a display apparatus, where a first beam cutter and a second beam cutter are used, one of the first and second beam cutters may rotate clockwise or counter-clockwise in a plane parallel to a first plane to increase or decrease a shielded area shielding from a line laser beam irradiated from a laser beam irradiating unit, similarly to the first beam cutter BC1 or the second beam cutter BC2 described above with reference to FIGS. 12 through 17. In such an embodiment, the other of the first beam cutter and the second beam cutter may move in a first direction (+x direction) or an opposite direction (−x direction) to the first direction to increase or decrease a shielded area shielding from a line laser beam irradiated from the laser beam irradiating unit, similarly to the first beam cutter BC1 or the second beam cutter BC2 of the laser annealing apparatus described above with reference to FIGS. 4 through 9.

According to an alternative exemplary embodiment of a method of manufacturing a display apparatus, a beam cutter may simultaneously rotate and linearly move. In one exemplary embodiment, for example, the first beam cutter BC1 as illustrated in FIG. 12 may rotate with respect to the first rotational axis BC1C, and the first rotational axis BC1C may be moved in the first direction (+x direction) or the opposite direction (−x direction) thereto at the same time.

According to an alternative exemplary embodiment of the method of manufacturing a display apparatus, when irradiating a line laser beam, the line laser beam may be irradiated to an amorphous silicon layer in a chamber through a window of the chamber, and the first beam cutter and the second beam cutter may be disposed in the chamber.

According to one or more exemplary embodiments, the laser annealing apparatus reduces a defect ratio and the method of manufacturing a display apparatus may be performed by using the laser annealing apparatus.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. A laser annealing apparatus comprising:
a substrate supporting unit which supports a substrate;
a laser beam irradiating unit which irradiates a line laser beam extending in a first direction to an amorphous silicon layer provided on the substrate on the substrate supporting unit;
a substrate moving unit which moves the substrate supporting unit in a second direction crossing the first direction;
a first beam cutter disposed between the substrate supporting unit and the laser beam irradiating unit; and
a second beam cutter disposed between the substrate supporting unit and the laser beam irradiating unit, and spaced apart from the first beam cutter,
wherein the first beam cutter and the second beam cutter move to increase or decrease a shielded area of the substrate, which is an area of the substrate overlapping the line laser beam and at least one of the first beam cutter and the second beam cutter, to shield from at least a portion of the line laser beam irradiated to a portion of the substrate outside the amorphous silicon layer, while the substrate moving unit moves the substrate supporting unit in the second direction and the laser beam irradiating unit irradiates the line laser beam to the amorphous silicon layer.

2. The laser annealing apparatus of claim 1, wherein the first beam cutter and the second beam cutter move in the first direction or an opposite direction to the first direction, to increase or decrease the shielded area of the substrate.

3. The laser annealing apparatus of claim 2, wherein as the substrate moving unit moves the substrate supporting unit in the second direction, a portion of the shielded area overlapping the first beam cutter and the line laser beam is decreased or increased.

4. The laser annealing apparatus of claim 3, wherein as the substrate moving unit moves the substrate supporting unit in the second direction, a portion of the shielded area overlapping the second beam cutter and the line laser beam is decreased or increased.

5. The laser annealing apparatus of claim 4, wherein
when the line laser beam is irradiated to a first section of the substrate, the first beam cutter moves in the first direction as the substrate moving unit moves the substrate supporting unit in the second direction, such that the portion of the shielded area overlapping the first beam cutter and the line laser beam is decreased,
when the line laser beam is irradiated to the first section of the substrate, the second beam cutter moves in an opposite direction to the first direction as the substrate moving unit moves the substrate supporting unit in the second direction, such that the portion of the shielded area overlapping the second beam cutter and the line laser beam is decreased,
when the line laser beam is irradiated to a second section of the substrate, the first beam cutter moves in the opposite direction to the first direction as the substrate moving unit moves the substrate supporting unit in the second direction, such that the portion of the shielded area overlapping the first beam cutter and the line laser beam is increased,
when the line laser beam is irradiated to the second section of the substrate, the second beam cutter moves in the opposite direction to the first direction as the substrate moving unit moves the substrate supporting unit in the second direction, such that the portion of the shielded area overlapping the second beam cutter and the line laser beam is decreased,
when the line laser beam is irradiated to a third section of the substrate, the first beam cutter moves in the opposite direction to the first direction as the substrate moving unit moves the substrate supporting unit in the second direction, such that the portion of the shielded area overlapping the first beam cutter and the line laser beam is increased, and
when the line laser beam is irradiated to the third section of the substrate, the second beam cutter moves in the first direction as the substrate moving unit moves the substrate supporting unit in the second direction, such that the portion of the shielded area overlapping the second beam cutter and the line laser beam is increased.

6. The laser annealing apparatus of claim 1, wherein the first beam cutter and the second beam cutter rotate clockwise or counter-clockwise with respect to axes perpendicular to a plane defined by the first direction and the second direction to increase or decrease the shielded area of the substrate.

7. The laser annealing apparatus of claim 6, wherein as the substrate moving unit moves the substrate supporting unit in the second direction, a portion of the shielded area overlapping the first beam cutter and the line laser beam is decreased and then increased.

8. The laser annealing apparatus of claim 7, wherein as the substrate moving unit moves the substrate supporting unit in the second direction, a portion of the shielded area overlapping the second beam cutter and the line laser beam is decreased and then increased.

9. The laser annealing apparatus of claim 8, wherein
when the line laser beam is irradiated to a first section of the substrate, the first beam cutter rotates clockwise as the substrate moving unit moves the substrate supporting unit in the second direction, such that the portion of the shielded area overlapping the first beam cutter and the line laser beam is decreased,
when the line laser beam is irradiated to the first section of the substrate, the second beam cutter rotates clockwise as the substrate moving unit moves the substrate supporting unit in the second direction, such that the portion of the shielded area overlapping the second beam cutter and the line laser beam is decreased,
when the line laser beam is irradiated to a second section of the substrate, the first beam cutter rotates counter-clockwise as the substrate moving unit moves the substrate supporting unit in the second direction, such that the portion of the shielded area overlapping the first beam cutter and the line laser beam is increased,
when the line laser beam is irradiated to the second section of the substrate, the second beam cutter rotates clockwise as the substrate moving unit moves the substrate supporting unit in the second direction, such that the portion of the shielded area overlapping the second beam cutter and the line laser beam is decreased,
when the line laser beam is irradiated to a third section of the substrate, the first beam cutter rotates counter-clockwise as the substrate moving unit moves the substrate supporting unit in the second direction, such that the portion of the shielded area overlapping the first beam cutter and the line laser beam is increased, and
when the line laser beam is irradiated to the third section of the substrate, the second beam cutter rotates counter-clockwise as the substrate moving unit moves the substrate supporting unit in the second direction, such that the portion of the shielded area overlapping the second beam cutter and the line laser beam is increased.

10. The laser annealing apparatus of claim 1, wherein
one of the first beam cutter and the second beam cutter rotates clockwise or counter-clockwise with respect to axes perpendicular to a plane defined by the first direction and the second direction to increase or decrease the shielded area of the substrate, and
the other of the first beam cutter and the second beam cutter moves in the first direction or in an opposite direction to the first direction to increase or decrease the shielded area of the substrate.

11. The laser annealing apparatus of claim 1, further comprising:
a chamber outside of which the laser beam irradiating unit is disposed,
wherein the substrate supporting unit is disposed in the chamber,
the line laser beam is irradiated from the laser beam irradiating unit to the substrate disposed on the substrate supporting unit through a window of the chamber, and
the first beam cutter and the second beam cutter are disposed in the chamber.

12. The laser annealing apparatus of claim 1, wherein
the substrate moving unit rotates the substrate supporting unit with respect to an axis perpendicular to a plane defined by the first direction and the second direction in a way such that a side of the substrate disposed on the substrate supporting unit forms an angle less than 90 degrees with the second direction, and
the substrate moving unit moves the substrate supporting unit, on which the substrate including the amorphous silicon layer provided thereon is disposed, in the second direction while the substrate supporting unit is rotated.

13. A method of manufacturing a display apparatus, the method comprising:
providing an amorphous silicon layer on a substrate; and
irradiating a line laser beam extending in a first direction onto the amorphous silicon layer on the substrate from a laser beam irradiating unit to convert the amorphous silicon layer into a polycrystalline silicon layer,
wherein the line laser beam is irradiated a plurality of times while the substrate, on which the amorphous silicon layer is provided, is being moved in the second direction,
wherein the substrate is rotated with respect to an axis perpendicular to a plane defined by the first direction and a second direction crossing the first direction in a way such that a side of the substrate forms an angle less than 90 degrees with respect to the second direction while the substrate is being moved in the second direction,
wherein the irradiating the line laser beam comprises:
moving the substrate in the second direction; and
increasing or decreasing a shielded area, which is an area of the substrate shielded from the line laser beam from the laser beam irradiating unit, as the substrate is moved in the second direction.

14. The method of claim 13, wherein the irradiating the line laser beam further comprises providing a first beam cutter and a second beam cutter between the amorphous silicon layer and the laser beam irradiating unit, wherein each of the first beam cutter and the second beam cutter is disposed to overlap at least a portion of the line laser beam, and
wherein the increasing or decreasing the shield area comprises moving the first beam cutter in the first direction or in an opposite direction to the first direction, as the substrate is moved in the second direction, to increase or decrease a portion of the shielded area overlapping the first beam cutter and the line laser beam.

15. The method of claim 14, wherein the irradiating the line laser beam further comprises moving the second beam cutter in the first direction or in the opposite direction to the first direction, as the substrate is moved in the second direction, to increase or decrease a portion of the shielded area overlapping the second beam cutter and the line laser beam.

16. The method of claim 15, wherein
the moving the first beam cutter in the first direction or in the opposite direction to the first direction comprises:
when the line laser beam is irradiated to a first section of the substrate, moving the first beam cutter in the first direction, as the substrate is moved in the second direction, to decrease the portion of the shielded area overlapping the first beam cutter and the line laser beam;
when the line laser beam is irradiated to a second section of the substrate, moving the first beam cutter in the opposite direction to the first direction, as the substrate is moved in the second direction, to increase the portion of the shielded area overlapping the first beam cutter and the line laser beam; and
when the line laser beam is irradiated to a third section of the substrate, moving the first beam cutter in the opposite direction to the first direction, as the substrate is moved in the second direction, to increase the portion of the shielded area overlapping the first beam cutter and the line laser beam, and
the moving the second beam cutter in the first direction or in the opposite direction to the first direction comprises:
when the line laser beam is irradiated to the first section of the substrate, moving the second beam cutter in an opposite direction to the first direction, as the substrate is moved in the second direction, to decrease the portion of the shielded area overlapping the second beam cutter and the line laser beam;
when the line laser beam is irradiated to the second section of the substrate, moving the second beam cutter in the opposite direction to the first direction, as the substrate is moved in the second direction, to decrease the portion of the shielded area overlapping the second beam cutter and the line laser beam; and
when the line laser beam is irradiated to the third section of the substrate, moving the second beam cutter in the first direction, as the substrate is moved in the second direction, to increase the portion of the shielded area overlapping the second beam cutter and the line laser beam.

17. The method of claim 15, wherein
the amorphous silicon layer is disposed in a chamber,
the line laser beam is irradiated to the amorphous silicon layer through a window of the chamber, and
the first beam cutter and the second beam cutter are disposed in the chamber.

18. The method of claim 13, wherein the irradiating the line laser beam further comprises providing a first beam cutter and a second beam cutter between the amorphous silicon layer and the laser beam irradiating unit, wherein each of the first beam cutter and the second beam cutter is disposed to overlap at least a portion of the line laser beam, and wherein the increasing or decreasing the shield area comprises rotating the first beam cutter clockwise or counter-clockwise with respect to an axis perpendicular to a plane defined by the first direction and the second direction, as the substrate is moved in the second direction, to increase or decrease a portion of the shielded area overlapping the first beam cutter and the line laser beam.

19. The method of claim 18, wherein the irradiating the line laser beam further comprises rotating the second beam cutter clockwise or counter-clockwise with respect to an axis perpendicular to the plane defined by the first direction and the second direction, as the substrate is moved in the second direction, to increase or decrease a portion of the shielded area overlapping the second beam cutter and the line laser beam.

20. The method of claim 19, wherein the rotating the first beam cutter clockwise or counter-clockwise comprises:

when the line laser beam is irradiated to a first section of the substrate, rotating the first beam cutter rotates clockwise, as the substrate is moved in the second direction, to decrease the portion of the shielded area overlapping the first beam cutter and the line laser beam;

when the line laser beam is irradiated to a second section of the substrate, rotating the first beam cutter counter-clockwise, as the substrate is moved in the second direction, to increase the portion of the shielded area overlapping the first beam cutter and the line laser beam; and when the line laser beam is irradiated to a third section of the substrate, rotating the first beam cutter counter-clockwise, as the substrate is moved in the second direction, to increase the portion of the shielded area overlapping the first beam cutter and the line laser beam, and the rotating the second beam cutter clockwise or counter-clockwise comprises:

when the line laser beam is irradiated to the first section of the substrate, rotating the second beam cutter clockwise, as the substrate is moved in the second direction, to decrease the portion of the shielded area overlapping the second beam cutter and the line laser beam;

when the line laser beam is irradiated to the second section of the substrate, rotating the second beam cutter clockwise, as the substrate is moved in the second direction, to decrease the portion of the shielded area overlapping the second beam cutter and the line laser beam; and when the line laser beam is irradiated to the third section of the substrate, rotating the second beam cutter counter-clockwise, as the substrate is moved in the second direction, to increase the portion of the shielded area overlapping the second beam cutter and the line laser beam.

21. The method of claim 19, wherein the amorphous silicon layer is disposed in a chamber, the line laser beam is irradiated to the amorphous silicon layer through a window of the chamber, and the first beam cutter and the second beam cutter are disposed in the chamber.

22. The method of claim 13, wherein the irradiating the line laser beam further comprises providing a first beam cutter and a second beam cutter between the amorphous silicon layer and the laser beam irradiating unit, wherein each of the first beam cutter and the second beam cutter is disposed to overlap at least a portion of the line laser beam, and wherein the increasing or decreasing the shield area comprises:

rotating the first beam cutter clockwise or counter-clockwise with respect to an axis perpendicular to a plane defined by the first direction and the second direction, as the substrate is moved in the second direction, to increase or decrease a portion of the shielded area overlapping the first beam cutter and the line laser beam; and moving the second beam cutter in the first direction or in the opposite direction to the first direction, as the substrate is moved in the second direction, to increase or decrease a portion of the shielded area overlapping the second beam cutter and the line laser beam.

23. The method of claim 22, wherein the amorphous silicon layer is disposed in a chamber, the line laser beam is irradiated to the amorphous silicon layer through a window of the chamber, and the first beam cutter and the second beam cutter are disposed in the chamber.

* * * * *